(12) United States Patent
Nishi et al.

(10) Patent No.: US 12,285,823 B2
(45) Date of Patent: Apr. 29, 2025

(54) LOW MELTING-POINT BONDING MEMBER, METHOD FOR PRODUCING SAME, SEMICONDUCTOR ELECTRONIC CIRCUIT, AND METHOD FOR MOUNTING SAID SEMICONDUCTOR ELECTRONIC CIRCUIT

(71) Applicant: SHINRYO CORPORATION, Kitakyushu (JP)

(72) Inventors: Hirotoshi Nishi, Kitakyushu (JP); Takeshi Sawai, Kitakyushu (JP); Kenichirou Shirokawa, Kitakyushu (JP); Souichirou Omae, Kitakyushu (JP)

(73) Assignee: SHINRYO CORPORATION, Kitakyushu (JP)

( * ) Notice: Subject to any disclaimer, the term of this patent is extended or adjusted under 35 U.S.C. 154(b) by 53 days.

(21) Appl. No.: 18/043,854

(22) PCT Filed: Aug. 27, 2021

(86) PCT No.: PCT/JP2021/031505
§ 371 (c)(1),
(2) Date: Mar. 2, 2023

(87) PCT Pub. No.: WO2022/050185
PCT Pub. Date: Mar. 10, 2022

(65) Prior Publication Data
US 2023/0347453 A1 Nov. 2, 2023

(30) Foreign Application Priority Data
Sep. 4, 2020 (JP) ................. 2020-149166

(51) Int. Cl.
| B23K 35/00 | (2006.01) |
|---|---|
| B23K 1/00 | (2006.01) |
| B23K 35/26 | (2006.01) |
| C22C 12/00 | (2006.01) |
| C22C 28/00 | (2006.01) |
| H05K 3/34 | (2006.01) |
| B23K 101/40 | (2006.01) |

(52) U.S. Cl.
CPC .......... *B23K 35/264* (2013.01); *B23K 1/0016* (2013.01); *C22C 12/00* (2013.01); *C22C 28/00* (2013.01); *H05K 3/3457* (2013.01); *B23K 2101/40* (2018.08)

(58) Field of Classification Search
CPC ................ B23K 35/264; B23K 1/0016; B23K 2101/40; B23K 35/26; C22C 12/00; C22C 28/00; C22C 30/00; C22C 30/04; H05K 3/3457; H05K 3/3436; H05K 3/3463; H05K 3/34; H01L 2224/16502; H01L 24/10; H01L 24/13; H01L 24/16; C23C 2/04
USPC .......... 228/56.3, 180.22, 245–246; 257/737–738; 438/612–616
See application file for complete search history.

(56) References Cited

U.S. PATENT DOCUMENTS

| 4,649,990 | A | * | 3/1987 | Kurihara | H01L 23/3731 257/E23.113 |
|---|---|---|---|---|---|
| 2001/0001990 | A1 | * | 5/2001 | Kitajima | B23K 35/025 174/260 |
| 2007/0227627 | A1 | * | 10/2007 | Suh | C22C 1/03 148/400 |
| 2008/0193324 | A1 | * | 8/2008 | Sato | C22C 30/04 420/499 |
| 2009/0108443 | A1 | * | 4/2009 | Jiang | H01L 24/13 257/737 |
| 2010/0159257 | A1 | * | 6/2010 | Yamaguchi | B23K 35/264 428/457 |
| 2015/0061129 | A1 | * | 3/2015 | Hattori | B23K 1/203 228/248.1 |
| 2017/0062374 | A1 | * | 3/2017 | Chu | H01L 24/09 |
| 2021/0114145 | A1 | * | 4/2021 | Akai | H05K 3/32 |
| 2021/0114147 | A1 | * | 4/2021 | Akai | H01B 1/02 |
| 2021/0229222 | A1 | * | 7/2021 | Akai | B22F 1/05 |
| 2022/0102603 | A1 | * | 3/2022 | Choi | H01L 24/13 |

FOREIGN PATENT DOCUMENTS

| CN | 202662683 | U | * | 1/2013 | |
|---|---|---|---|---|---|
| CN | 103432624 | A | * | 12/2013 | |
| CN | 104959621 | A | * | 10/2015 | |
| CN | 207217235 | U | * | 4/2018 | |
| CS | 232955 | B1 | * | 2/1985 | |
| DE | 102009017692 | A1 | * | 1/2011 | ............ H01L 24/11 |
| JP | H06325670 | A | | 11/1994 | |
| JP | H08264916 | A | * | 10/1996 | |
| JP | 2001-219267 | A | | 8/2001 | |
| JP | 3224185 | B2 | | 10/2001 | |
| JP | 3347512 | B2 | | 11/2002 | |
| JP | 2003-013165 | A | | 1/2003 | |
| JP | 2006044087 | A | * | 2/2006 | |

(Continued)

OTHER PUBLICATIONS

Machine translation of JP 2003-131565 (no date available).*

(Continued)

*Primary Examiner* — Kiley S Stoner
(74) *Attorney, Agent, or Firm* — Muncy, Geissler, Olds & Lowe, P.C.

(57) ABSTRACT

A low melting-point bonding member includes a low melting-point alloy containing Bi: 46 mass % or more and 72 mass % or less, In: 26 mass % or more and 54 mass % or less, and Sn: 2 mass % or less when a total amount of Bi, In, and Sn is 100 mass % and having a melting point of 86 to 111° C. A method for producing a low melting-point bonding member, including a plating step of performing a plating process including at least Bi plating and In plating and forming, on an object to be plated, a plating layer containing Bi: 46 mass % or more and 72 mass % or less, In: 26 mass % or more and 54 mass % or less, and Sn: 2 mass % or less when a total amount of Bi, In, and Sn is 100 mass %.

9 Claims, 22 Drawing Sheets

(56) References Cited

FOREIGN PATENT DOCUMENTS

| JP | 2007235091 | A | | 9/2007 | |
| --- | --- | --- | --- | --- | --- |
| JP | 2009093868 | A | * | 4/2009 | |
| JP | 2009283371 | A | * | 12/2009 | |
| JP | 2010048664 | A | * | 3/2010 | |
| JP | 2012092228 | A | * | 5/2012 | |
| JP | 2017-216300 | A | | 12/2017 | |
| JP | 2018079480 | A | * | 5/2018 | |
| JP | 2018140436 | A | * | 9/2018 | ............ B22F 1/0048 |
| JP | 6493604 | B1 | * | 4/2019 | |
| JP | 2019150880 | A | * | 9/2019 | ............ B22F 1/0048 |
| JP | 6761199 | B1 | * | 9/2020 | ................ B22F 1/17 |
| JP | 2021041430 | A | * | 3/2021 | |
| JP | 2021048391 | A | * | 3/2021 | ............ B23K 1/0016 |
| JP | 2021048392 | A | * | 3/2021 | ............ B23K 1/0016 |
| TW | 202000764 | A | | 1/2020 | |
| WO | 2006008842 | A1 | | 1/2006 | |
| WO | 2008016140 | A1 | | 2/2008 | |
| WO | WO-2016181138 | A1 | * | 11/2016 | ............... A61F 2/04 |
| WO | 2020004512 | A1 | | 1/2020 | |
| WO | WO-2021049437 | A1 | * | 3/2021 | ........... B23K 1/0016 |

OTHER PUBLICATIONS

Machine translation of JPH08150493A (no date available).*
International Preliminary Report on Patentability for the corresponding International Application No. PCT/JP2021/031505 issued Mar. 7, 2023, which includes English translation of Written Opinion of the International Searching Authority for the corresponding International Application No. PCT/JP2021/031505 mailed Nov. 16, 2021.
Office Action of the corresponding TW application No. 110132589 mailed Oct. 8, 2024 and English translation thereof.
Office Action of the corresponding KR application No. 10-2023-7010240 mailed Nov. 25, 2024 and English translation thereof.

* cited by examiner

LOW MELTING-POINT BONDING MEMBER, METHOD FOR PRODUCING SAME, SEMICONDUCTOR ELECTRONIC CIRCUIT, AND METHOD FOR MOUNTING SAID SEMICONDUCTOR ELECTRONIC CIRCUIT

TECHNICAL FIELD

The present invention relates to a lead-free solder material for semiconductor mounting, and particularly to a low melting-point bonding member that can be used in a low temperature region, and a method for producing the same. Further, the present invention relates to a semiconductor electronic circuit using these and a method for mounting the semiconductor electronic circuit.

BACKGROUND ART

In recent years, regulations on harmful substances to the environment have become more and more strict due to RoHS regulations, etc., and solder alloys used for the purpose of bonding electronic components including semiconductor chips to printed wiring boards (PWB) are also subject to regulation. Since lead (Pb) has been used as a main component of these solder components for a long time, solder alloys containing no lead (hereinafter, also referred to as Pb-free solder alloys) have been actively developed.

Conductive bonding materials such as solder alloys used when bonding electronic components to a printed wiring board are roughly classified into high temperature uses (about 260° C. to 400° C.) and medium and low temperature uses (about 140° C. to 230° C.) depending on the usage limit temperature. Among them, a solder alloy for low temperature uses generally refers to a solder alloy having a melting point lower than the melting point of 183° C. of the eutectic alloy of Pb-63Sn.

However, recently, some of electronic components, such as flexible resin substrates and PZT (lead zirconate titanate) substrates of piezoelectric ceramics, have very low heat resistance, and their functions may be deteriorated or destroyed when exposed to high temperatures. As for the bonding temperature at the time of mounting, since it is necessary to solder such electronic components at a low temperature of 140° C. or less, preferably 135° C. or less, and more preferably 130° C. or less, a solder alloy for low temperature uses having a lower melting point is required.

Further, in integrated circuits, reduction of cost per function has been promoted by miniaturizing CMOS technology, and recently in a mounting step as well, higher integration has been promoted by integrating miniaturized chips at the package level to increase the number of chips, layers, and functions per unit area. The bonding method in mounting has also been progressing from bonding wires to solder balls and solder bump bonding, and there is demand for simplification and cost reduction of solder bonding at the time of mounting.

Conventionally, as a Pb-free solder, Sn-3.5Ag (melting point=221° C.), Sn-0.7Cu (melting point=227° C.), Sn—Ag—Cu (melting point=217° C.), and the like have been used. However, these solder alloys each have a high melting point of 200° C. or more, and it is difficult to use them at a soldering temperature of 140° C. or less at the time of semiconductor mounting.

As a Pb-free low-temperature solder alloy, Patent Literature 1 describes a solder alloy for low-temperature bonding composed of Sn: 37 to 47 mass %, Ag: 0.1 or more and less than 1.0 mass %, with the balance being Bi.

Patent Literature 2 describes a solder alloy composed of Sn: 40 mass %, Bi: 55 mass %, and In: 5 mass %, and a solder alloy composed of Sn: 34 mass %, Bi: 46 mass %, and In: 20 mass %. Further, a solder powder or a solder paste obtained by shaping the solder alloy into a sphere, a soldering method using these, and the like are described.

Patent Literature 3 describes a method for forming a Sn—In—Bi solder alloy plating layer, including: first plating a first layer of a tin/indium layer, then plating a second layer of a bright tin/bismuth layer on the tin/indium layer, and consecutively reflowing the first and second plating layers.

CITATION LIST

Patent Literature

Patent Literature 1: Japanese Patent No. 3347512
Patent Literature 2: Japanese Patent No. 3224185
Patent Literature 3: Japanese Patent Laid-Open No. 2001-219267

SUMMARY OF INVENTION

Technical Problem

The Sn—Bi—Ag-based solder alloy described in Patent Literature 1 has a melting point of 137 to 139° C. Since the bonding temperature at the time of mounting often needs to be about the melting point+20° C., the bonding temperature at the time of mounting needs to be 157° C. or more, and bonding is not possible at 140° C. or less.

The Sn—Bi—In-based solder alloy described in Patent Literature 2 also has a melting point of 117 to 139° C. Usually, since the bonding temperature at the time of mounting is performed at a temperature that is about 20° C. higher than the melting point of the solder alloy, the bonding temperature of the solder alloy at the time of mounting needs to be at least 137 to 159° C. A range in which bonding is possible at 140° C. or less is included by selecting limited compositions in which the solder alloy only constitutes a part thereof. However, the solder alloy is made by mixing three kinds of metals: Sn—Bi—In, and heating and melting the mixture in an electric furnace (400° C.). Therefore, it requires a step of "mixing of metal→heating and melting" as well as a step of "crushing→solder paste forming" as the next step to achieve a soldering material so that productivity is poor. The literature only describes that the solder alloy is plated on a surface of an object to be plated, without showing details of the plating process.

Since the Sn—In—Bi solder alloy plating layer obtained by the plating method described in Patent Literature 3 is composed of Bi: 10 mass % or less, In: 20 mass % or less, with the balance being Sn and the melting point is 180 to 220° C., the reflow temperature is about 260° C. which is extremely high and, therefore, bonding cannot be achieved when the bonding temperature at the time of mounting is 140° C. or less.

In addition, in order to meet the demand for higher functionality of smartphones and sensors, there is expected increase in demand for wiring substrates and electronic elements with low heat resistance, such as resin substrates, piezoelectric elements, CdTe semiconductor elements, CCD elements, and hologram elements, which are used for flexible boards and stretchable boards. Accordingly, there is a demand for the development of conductive bonding materials and bonding methods thereof that enable bonding at low temperatures (140° C. or less) in the mounting step.

Furthermore, given the fact that the temperature of electronic products that use these conductive bonding materials may rise to around 60 to 80° C. in normal usage environments due to seasonal fluctuations, indoor/outdoor fluctuations, and self-heating due to operation of the electronic products, there is a concern that a problem in durability such as a decrease in bonding strength may occur if the melting point of the bonding materials is 80° C. or less. Therefore, a higher temperature such as, preferably, 85° C. or more is conceivably required as the melting point of the bonding materials.

As mentioned above, in recent years, regulations on harmful substances such as RoHS regulations have become stricter. Since Pb-containing solder alloys that have been used as conductive bonding materials in conventional production steps of semiconductor products are also subject to regulation, a conversion to Pb-free solder alloys is required.

Further, with the progress of miniaturization of integrated circuits, there are demands for high reliability such as an improvement in bonding accuracy at the time of mounting and an improvement in simplification of a bonding step as well as cost reduction.

The present invention has been made in view of such problems, and it is an object of the present invention to provide a Pb-free low melting-point conductive bonding member which has high bonding reliability, which enables low temperature bonding at 140° C. or less, and which enables bonding durability in normal usage environments of electronic products to be maintained.

Solution to Problem

The melting points of Sn—Ag-base, Sn—Cu-base, and Sn—Ag—Cu-base, which are conventional Pb-free conductive bonding materials, are 200° C. or more, and the melting points of Sn—Bi-base and Sn—Bi—In-base are about 120° C. or more. The reflow temperature (bonding temperature) at the time of mounting needs to be higher than these melting points by about 20° C. or more. Therefore, the reflow temperature is at least 140° C. or more, which is not always suitable for a low temperature bonding method. In addition, because after mixing and melting metal solder components to create a solder alloy, the solder alloy is crushed and pulverized into solder alloy fine particles which is then made into a paste to be used, it is also a problem that producing the solder alloy is complicated, labor and cost intensive, and poor in terms of productivity.

However, the present inventors found that it is possible to improve simplicity of an electronic component mounting step by forming a plating layer containing Bi, In, and Sn in a specific composition and either using the plating layer as it is or subjecting the plating layer to heating and reflowing and then bumping and that, since the melting points of the plating layer and the bumps range from 86 to 111° C., it is possible to perform mounting at a low temperature of 140° C. or less, and based on these findings, the present invention has been completed.

That is, the gist of the present invention is as follows.

<1> A low melting-point bonding member, including a low melting-point alloy containing Bi: 46 mass % or more and 72 mass % or less, In: 26 mass % or more and 54 mass % or less, and Sn: 2 mass %, or less when a total amount of Bi, In, and Sn is 100 mass % and having a melting point of 86 to 111° C.

<2> The low melting-point bonding member according to <1> described above, wherein when a total amount of Bi, In, and Sn in the low melting-point alloy is 100 mass %, the low melting-point alloy contains Bi: 46 mass % or more and 72 mass % or less, In: 26 mass % or more and 53.9 mass % or less, and Sn: 0.1 mass % or more and 2 mass % or less.

<3> The low melting-point bonding member according to <1> or <2> described above, wherein when a total amount of Bi, In, and Sn in the low melting-point alloy is 100 mass %, the low melting-point alloy contains Bi: 46 mass % or more and 51 mass % or less, In: 47 mass % or more and 54 mass % or less, and Sn: 2 mass % or less and has a melting point of 86 to 91° C.

<4> The low melting-point bonding member according to <1> or <2> described above, wherein when a total amount of Bi, In, and Sn in the low melting-point alloy is 100 mass %, the low melting-point alloy contains Bi: 63 mass % or more and 72 mass % or less, In: 26 mass % or more and 37 mass % or less, and Sn: 2 mass % or less and has a melting point of 106 to 111° C.

<5> The low melting-point bonding member according to any one of <1> to <4> described above, further including a plating layer formed of the low melting-point alloy.

<6> The low melting-point bonding member according to any one of <1> to <4> described above, further including a bump formed by heating and reflowing a plating layer formed of the low melting-point alloy.

<7> The low melting-point bonding member according to any one of <1> to <6> described above, wherein the low melting-point alloy contains one or more mixed components selected from the group consisting of Ag, Cu, Ni, Zn, and Sb, and wherein a total mass of the mixed components in the low melting-point alloy is 0.001 mass % or more and 3.0 mass %, or less.

<8> The low melting-point bonding member according to any one of <1> to <7> described above, wherein the low melting-point alloy is disposed on a film formed of one or more kinds of undermetal selected from the group consisting of Ti, Ni, Cu, Au, Sn, Ag, Cr, Pd, Pt, W, Co, TiW, NiP, NiB, NiCo, and NiV.

<9> The low melting-point bonding member according to any one of <1> to <8> described above, further including a micro member having a size of 1 mm or less and having the low melting-point alloy coating a surface layer of any core material selected from the group consisting of a micro metal ball, a micro resin ball having a coating layer of a conductive metal, a micro resin ball having a coating layer of a solder alloy, and a micro pin member.

<10> The low melting-point bonding member according to <9> described above, wherein the micro member is mounted on a conductive bonding portion.

<11> A method for producing a low melting-point bonding member, including a plating step of performing a plating process including at least Bi plating and In plating and forming, on an object to be plated, a plating layer containing Bi: 46 mass % or more and 72 mass % or less, In: 26 mass % or more and 54 mass % or less, and Sn: 2 mass % or less when a total amount of Bi, In, and Sn is 100 mass %.

<12> The method for producing a low melting-point bonding member according to <11> described above, wherein the plating step is a plating step (A) or a plating step (B) described below.

Plating step (A): a step in which the plating process includes Bi plating and In plating and in which the In plating is performed after the Bi plating is performed Plating step (B): a step in which the plating process includes Bi plating, In plating, and Sn plating and in which the plating process to be first performed on the object to be plated is Sn plating or Bi plating, and the In plating is performed after the Sn plating and the Bi plating are performed.

<13> A method for producing a low melting-point bonding member, including forming a bump by heating and reflowing a low melting-point bonding member which is produced by the method for producing a low melting-point bonding member according to <11> or <12> described above and which is disposed on a conductive bonding portion.

<14> A semiconductor electronic circuit, including a low melting-point bonding member according to any one of <1> to <10> described above.

<15> A method for mounting a semiconductor electronic circuit, including heating and reflowing, in a range from 105 to 140° C., the low melting-point bonding member according to any one of <1> to <10> described above which is disposed between a wiring substrate and a semiconductor chip surface, thereby bonding the wiring substrate and the semiconductor chip.

Advantageous Effects of Invention

The low melting-point bonding member according to the present invention is a Pb-free low melting-point conductive bonding member which has high bonding reliability, which enables low temperature bonding at 140° C. or less, and which enables bonding durability in normal usage environments of electronic products to be maintained. In addition, the production method of the present invention enables a Pb-free composition to be easily adjusted and enables the low melting-point bonding member of the present invention to be produced in a simple manner.

DESCRIPTION OF EMBODIMENTS

The present invention will be described in detail below, but the present invention will not be limited to the following embodiments, and can be variously modified to be carried out within the scope of the gist thereof. Note that, when the expression "-" (or "to") is used in this specification, it shall be used as an expression including numerical values or physical property values before and after the expression.

<Low Melting-Point Bonding Member of Present Invention>

The present invention relates to a low melting-point bonding member including a low melting-point alloy containing Bi: 46 mass % or more and 72 mass % or less, In: 26 mass % or more and 54 mass % or less, and Sn: 2 mass % or less when a total amount of Bi, In, and Sn is 100 mass % and having a melting point of 86 to 111° C. (hereinafter, may be referred to as "the bonding member of the present invention").

The bonding member of the present invention enables a Pb-free composition to be readily adjusted, enables bonding at a low temperature, and is excellent in low temperature mountability.

Since the melting point of the low melting-point alloy controlled to the composition range described above is 86 to 111° C., a major contribution can be made towards realizing low temperature mounting of an integrated circuit by using the low melting-point alloy as a bonding member. Further, since the bonding member of the present invention can be treated at a low temperature, it is also possible to reduce the energy consumed at the time of mounting. In addition, when the bonding member is to be produced by plating, it is also possible to reduce the energy consumed by heat treatment for alloying.

With the bonding member of the present invention, since an adhesive strength when bonding the low melting-point alloy and a member on which the low melting-point alloy is disposed by heating and reflowing expresses a strength either equaling or surpassing 3 mg/µm² being an adhesive strength of existing Pb-free solders (alloys such as Sn2.5Ag, Sn3.2Ag, and Sn58Bi), the bonding member of the present invention can be used as a conductive bonding material for mounting.

In addition, since the low melting-point alloy of the bonding member of the present invention has a melting point of 86 to 111° C., the bonding member of the present invention has sufficient bonding durability under normal use temperature environments of electronic products.

[Low Melting-Point Alloy]

The low melting-point alloy contained in the bonding member of the present invention contains Bi: 46 mass % or more and 72 mass % or less, In: 26 mass % or more and 54 mass % or less, and Sn: 2 mass % or less when a total amount of Bi, In, and Sn is 100 mass % and has a melting point of 86 to 111° C.

Figure 1:
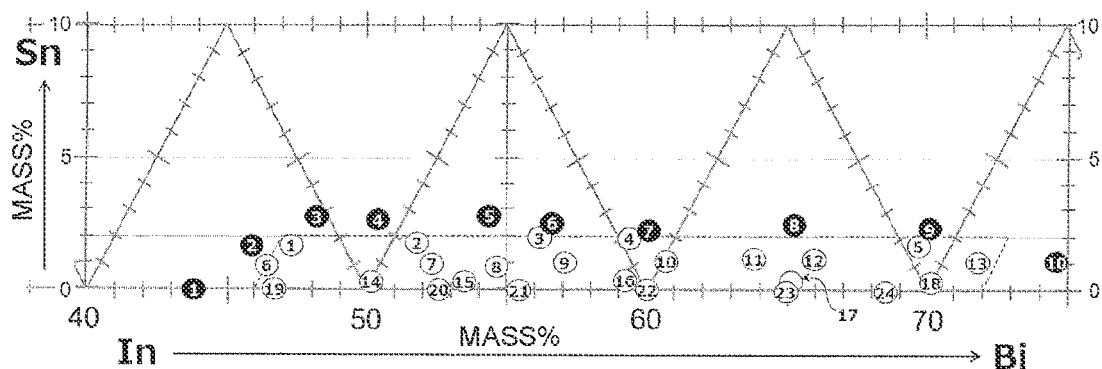
FIG. 1 is a partial enlarged view of a Sn—Bi—In ternary phase diagram.

FIG. 1 is a partial enlarged view of a Bi—In—Sn ternary phase diagram for explaining a low melting-point alloy used in the bonding member of the present invention. The low melting-point alloy used in the bonding member related to the present invention has a composition in a specific range including a base InBi (in other words, including a Sn concentration of 0%) of the Bi—In—Sn ternary phase diagram. Specifically, concentrations of Bi (bismuth), In (indium), and Sn (tin) are controlled to within a range represented by a quadrangle in the Bi—In—Sn ternary phase diagram, the quadrangle having four vertices including: Point 1 (46, 54, 0), Point 2 (72, 28, 0), Point 3 (72, 26, 2), and Point 4 (46, 52, 2), where Point (x, y, z) is defined as a point of x mass % Bi, y mass % In, and z mass % Sn.

In other words, the low melting-point alloy constituting the bonding member of the present invention is a Bi—In-based low melting-point alloy containing no Sn or a Bi—In—Sn-based low melting-point alloy containing Sn.

By subjecting the two components Bi and In or the three components Bi, In, and Sn to laminated plating within such a composition range, a plating layer with a melting point of 86 to 111° C. is created. In addition, by heating and melting the plating layer at 105 to 140° C., the heated and melted plating layer can be used as a solder alloy having a melting point equivalent to that of the plating layer. Furthermore, the melting points of the plating layer and the solder alloy having the composition described above can be stably set to 86 to 111° C. and can be bonded by heating and reflowing in a low temperature region of 105 to 140° C., which is suitable for low temperature mounting. Moreover, a bonding member with high bonding reliability can be obtained.

Note that melting points in the present invention are obtained using a DSC (differential scanning calorimeter). In an endothermic profile of an elevated temperature process of a DSC, the heat of fusion of each component appears as an endothermic peak. A single or a plurality of endothermic peaks appear depending on the composition of a measurement sample. In the present invention, for convenience, the top temperature of each endothermic peak is treated as the melting point of the component, and when there is a plurality of peaks, the endothermic peak of the lowest temperature is treated as the lowest melting point (solidus temperature) and the endothermic peak of the highest temperature is treated as the highest melting point (liquidus temperature).

A content of Bi relative to a total amount of Bi, In, and Sn in the low melting-point alloy is 46 to 72 mass %. When Bi: less than 46 mass %, since an endothermic peak occurs at less than 86° C. and a low melting-point component of less than 86° C. is included, there is a concern that temperature durability may decrease under normal use environments, which is not preferable. On the other hand, when Bi exceeds 72 mass %, endothermic peak intensity at 272° C. arising from residual Bi increases and a high-melting point component tends to increase, which is also not preferable. When a high-melting point component attributable to residual Bi is included, unmelted material remains after heating and reflowing at 140° C. and there is a concern that reliability as a bonding material such as bonding strength and dimensional accuracy may decline.

A content of In relative to a total amount of Bi, In, and Sn in the low melting-point alloy is 26 to 54 mass %. When In: less than 26 mass %, an endothermic peak occurs at 272° C. near the melting point of Bi and a high-melting point component derived from residual Bi is included, which is not preferable. On the other hand, when In: more than 54 mass %, an endothermic peak occurs at less than 86° C. and a low melting-point component of less than 86° C. is included, which is also not preferable. Moreover, due to a higher proportion of relatively expensive In, the cost increases and the versatility deteriorates.

A content of Sn relative to a total amount of Bi, In, and Sn in the low melting-point alloy is 2 mass % or less. When Sn: more than 2.0 mass %, an endothermic peak occurs at less than 86° C. and a low melting-point component of less than 86° C. is included, which is not preferable. Sn may be less than 1.0 mass %, 0.9 mass % or less, or 0.8 mass % or less.

The low melting-point alloy may be configured so as not to contain Sn (Sn: 0 mass %) as a Bi—In-based low melting-point alloy.

In addition, Sn may be contained at 0.1 mass % or more, 0.2 mass % or more, or 0.3 mass % or more. By setting Sn to 0.1 mass % or more, an improvement in wettability with an object to be plated or an object to be bonded and an improvement in bonding strength or bonding durability are expected.

For example, the low melting-point alloy may be a Bi—In—Sn-based low melting-point alloy containing Bi: 46 to 72 mass %, In: 26 to 53.9 mass %, and Sn: 0.1 to 2 mass % or a Bi—In—Sn-based low melting-point alloy containing Bi: 46 to 72 mass %, In: 27.1 to 53.9 mass %, and Sn: 0.1 to 0.9 mass % when a total amount of Bi, In, and Sn is 100 mass %.

The melting point of the low melting-point alloy used for the bonding member of the present invention is 86° C. to 111° C. Electronic products that use solder alloys as the conductive bonding material when mounting semiconductor electronic components are used in normal usage environments where seasonal fluctuations, indoor/outdoor fluctuations, and self-heating due to the operation of electronic products occur. Therefore, when the melting point is 80° C. or less, there is a concern that bonding strength may decrease, and durability may be insufficient.

In the DSC measurement of low melting-point alloys, since those that show DSC charts as shown in (a) to (c) below have a narrow temperature range of the melting point which appears as an endothermic peak (from a solidus temperature to a liquidus temperature), it is possible to reduce the time for heating and reflowing at the time of mounting, and an effect of improving the bonding reliability can be expected which is preferable:

(a) a profile which shows a single endothermic peak,
(b) a profile which shows a plurality of endothermic peaks, but in which compared to the height of the largest endothermic peak, the height of any other endothermic peak is 1/10 or less, and
(c) a profile which shows a plurality of endothermic peaks each having a large endothermic peak, but in which the difference in the top temperature among the endothermic peaks each having a large endothermic peak is 5° C. or less.

The low melting-point alloy preferably contains Bi: 46 to 51 mass %, In: 47 to 54 mass %, and Sn: 0 to 2 mass %. The low melting-point alloy with such a composition shows a single endothermic peak with a peak top at 86° C. to 91° C. In addition, even when a plurality of endothermic peaks is shown, DSC charts as described in (a) to (c) above are shown such as an endothermic peak height of an endothermic peak with a peak top at 86° C. to 91° C. being larger than other endothermic peaks.

For example, the low melting-point alloy may contain Bi: 46 mass % or more and 51 mass, or less, In: 49 mass % or more and 54 mass % or less, and no Sn (Sn: 0 mass %). The low melting-point alloy may contain Bi: 46 mass % or more and 51 mass % or less, In: 47 mass % or more and 53.9 mass % or less, and Sn 0.1 mass % or more and 2 mass % or less. The low melting-point alloy may contain Bi: 46 mass % or more and 51 mass % or less, In: more than 48 mass % and 53.9 mass % or less, and Sn 0.1 mass % or more and less than 1 mass %. The low melting-point alloy may contain Bi: 46 mass % or more and 51 mass % or less, In: 48.1 mass % or more and 53.9 mass % or less, and Sn 0.1 mass % or more and 0.9 mass % or less. The low melting-point alloy may contain Bi: 46 mass, or more and 51 mass, or less, In: 48.1 mass % or more and 53.7 mass % or less, and Sn 0.3 mass % or more and 0.9 mass %, or less.

In addition, the low melting-point alloy preferably contains Bi: 63 to 72 mass %, In: 26 to 37 mass %, and Sn: 0 to 2 mass %. The low melting-point alloy with such a composition shows a single endothermic peak with a peak top at 106° C. to 111° C. In addition, even when a plurality of endothermic peaks is shown, DSC charts as described in (a) to (c) above are shown such as an endothermic peak height of an endothermic peak with a peak top at 106° C. to 111° C. being larger than other endothermic peaks.

For example, the low melting-point alloy may contain Bi: 63 mass %, or more and 72 mass %, or less, In: 28 mass % or more and 37 mass % or less, and no Sn (Sn: 0 mass %). The low melting-point alloy may contain Bi: 63 mass % or more and 72 mass % or less, In: 26 mass % or more and 36.9 mass % or less, and Sn 0.1 mass % or more and 2 mass % or less. The low melting-point alloy may contain Bi: 63 mass % or more and 72 mass % or less, In: more than 27 mass % and 36.9 mass % or less, and Sn 0.1 mass % or more and less than 1 mass %. The low melting-point alloy may contain Bi: 63 mass % or more and 72 mass % or less, In: 27.1 mass % or more and 36.9 mass % or less, and Sn 0.1 mass %, or more and 0.9 mass % or less. The low melting-point alloy may contain Bi: 63 mass % or more and 72 mass % or less, In: 27.1 mass % or more and 36.7 mass % or less, and Sn 0.3 mass % or more and 0.9 mass % or less.

The mass concentrations of Bi, In, and Sn in the low melting-point alloy are concentrations of the respective components of Bi, In, and Sn having been converted when a total of Bi, In, and Sn is assumed to be 100 mass %, in a low melting-point alloy portion of a plating layer, a solder alloy bump, a coating layer of a micro core material, and the like.

Preferably, these compositions are appropriately selected and used in accordance with heat resistance required by a bonding member in mounting.

The low melting-point alloy may contain components other than Bi, In, and Sn. For example, the low melting-point alloy may be an alloy made up of a mixed component and inevitably-contained impurities in addition to Bi, In, and Sn. In addition, the low melting-point alloy may be an alloy made up of Bi, In, a mixed component, and inevitably-contained impurities.

(Mixed Components)

A mixed component may be appropriately contained for the purpose of improving physical properties such as smoothness and adhesiveness of a film of a plating layer within a range where the melting point is not more than 111° C. For example, the low melting-point alloy may contain one or more mixed components selected from the group consisting of Ag, Cu, Ni, Zn, and Sb, in which the percentage of the total mass of the mixed components in the low melting-point alloy (total mass of mixed components/mass of alloy) is within a range of 0.001 to 3.0 mass %.

In addition, it is preferable to reduce the mixed amount of Pb for using as Pb-free, and the concentration of Pb in the low melting-point alloy is preferably 0.1 mass %, or less, more preferably 0.05 mass % or less, and more preferably 0.01 mass % or less. It is more preferable that Pb is not more than a lower limit of detection.

The low melting-point alloy may contain impurities that are inevitably contained in the raw material and the production step. Examples of such impurities include Fe (iron) and C (carbon).

Further, the percentage of the total amount of Sn, Bi and In with respect to the low melting-point alloy (total mass of Sn, Bi and In/whole mass of low melting-point alloy) is preferably 70 mass % or more, more preferably 80 mass % or more, further preferably 90 mass % or more, and further preferably 95 mass % or more. Moreover, it may be 97 mass % or more, 98 mass % or more, and 99 mass % or more.

(Plating Layer)

The low melting-point alloy can form a plating layer. The bonding member of the present invention can be obtained by forming the plating layer on a surface of a substrate or a micro core material. The plating layer will be described in detail in the production method of the present invention.

(Solder Alloy Bump)

The low melting-point alloy can form a solder alloy bump. For example, the solder alloy bump can be formed by heating and reflowing a plating layer containing Bi: 46 to 72 mass %, In: 26 to 54 mass %, and Sn: 0 to 2 mass %. By heating and reflowing a plating layer formed on a substrate, it is possible to obtain a bonding member including the substrate and a solder alloy bump made up of the low melting-point alloy formed on the substrate.

(Coating Layer of Micro Core Material)

The low melting-point alloy can form a coating layer for coating the surface of any micro core material whose size is 1 mm or less and which is selected from the group consisting of a micro metal ball, a micro resin ball having a coating layer of conductive metal, a micro resin ball having a coating layer of solder alloy, and a micro pin member. Coating of a micro core material may be performed by coating with plating or coating with the low melting-point alloy.

[Bonding Member]

Since the low melting-point alloy used in the bonding member of the present invention has a melting point in a range of 86 to 111° C., it melts when heated at or above the melting point, and is solid below the melting point and around normal temperature of about 20 to 30° C. Since a plating layer and a solder alloy bump which are made of the low melting-point alloy and a micro core material which is coated by the low melting-point alloy function as a bonding portion, a member which has a plating layer made of the low melting-point alloy, a solder alloy bump made of the low melting-point alloy, or a micro core material coated by the low melting-point alloy as a bonding portion and which is to be bonded to an object to be bonded is called a bonding member in the present invention.

The bonding member of the present invention may be a plating layer itself made of the low melting-point alloy or a solder alloy bump itself made of the low melting-point alloy.

Since a bump (a solder alloy bump or a micro member mounting-type bump) can be formed by heating and reflowing a plating layer formed of the low melting-point alloy, the bonding member of the present invention can include a bump made by heating and reflowing a plating layer formed of the low melting-point alloy.

The bonding member of the present invention may have a substrate and a low melting-point alloy (a plating layer or a solder alloy bump) formed on the substrate. For example, the bonding member of the present invention may be made up of a substrate having an undermetal layer including one or more undermetals selected from the group consisting of Ti, Ni, Cu, Au, Sn, Ag, Cr, Pd, Pt, W, Co, TiW, NiP, NiB, NiCo, and NiV, and a low melting-point alloy disposed on the undermetal layer. Examples of the substrate having an undermetal layer include semiconductor chips, or the like.

The bonding member of the present invention may have a micro member having a low melting-point alloy (a plating layer or a coating layer made of a solder alloy) on the surface of a micro core material. Moreover, a micro member having a low melting-point alloy on the surface of the micro core material, may be disposed on a substrate or the like to obtain a bonding member. For example, by mounting a micro member, in which a micro core material is coated with a plating layer, on a conductive bonding portion of the substrate provided with the conductive bonding portion, and subjecting them to heating and reflowing, it is possible to obtain a bonding member having a substrate provided with the conductive bonding portion and a micro member mounting-type bump disposed on the conductive bonding portion.

As a member for forming a plating layer or a solder alloy bump, and a member for disposing a micro core material and a micro member, in which the surface of the micro core material is coated with a low melting-point alloy, the object to be plated described in the production method of the present invention can be used.

<Production Method of Low Melting-Point Bonding Member of Present Invention>

The bonding member of the present invention can be obtained, for example, by: a method of mixing respective raw material metals of a low melting-point alloy and melting them to make a low melting-point solder alloy; a method of performing laminated plating of each of two components or three components on the surface of an object to be plated such that the respective concentrations of Bi, In, and Sn are within a predetermined composition range to form a low melting-point plating layer; and a method of heating and reflowing this plating layer to form a low melting-point solder alloy bump.

Among these methods, the method utilizing the formation of a low melting-point plating layer (a plating lamination method) is easier in adjusting the composition, and allows to perform alloying of Bi—In or Bi—In—Sn and bump formation thereof at once so that such method is excellent in convenience and bonding reliability, and is industrially usable.

<Production Method of Present Invention>

The bonding member of the present invention is preferably produced by a production method (hereinafter, this production method may be referred to as "the production method of the present invention") including a plating step of performing a plating process including at least Bi plating and In plating and forming, on an object to be plated, a plating layer containing Bi: 46 mass % or more and 72 mass % or less, In: 26 mass %, or more and 54 mass % or less, and Sn: 2 mass % or less when a total amount of Bi, In, and Sn is 100 mass %.

The production method of the present invention enables the bonding member of the present invention to be produced in an efficient manner. The production method of the present invention can easily adjust the composition of Pb-free. In addition, the obtained bonding member can be bonded at a low temperature and is excellent in low temperature mountability. Moreover, laminating by plating enables reproducibility of the composition of the plating layer to be achieved, and it is easy to arbitrarily control the plating layer so that the composition is within a composition range of the low melting-point alloy.

Furthermore, plating is also suitable for alloying and the like and it is also possible to reduce energy consumed for the heat treatment at the time of production.

In the present invention, the bonding member of the present invention can be produced by the production method of the present invention. In the present invention, it is possible to mutually utilize configurations corresponding to the respective aspects of the production method of the present invention and the bonding member of the present invention.

Hereinafter, materials and each step to be used in the production method of the present invention will be described.

[Object to be Plated]

The object to be plated is a member on which a plating layer is to be formed (disposed). Further, since a solder alloy can be formed by heating and reflowing a plating layer formed on the substrate, the object to be plated may also be a member on which solder bumps are formed.

(Substrate)

Examples of the object to be plated that is an object of the production method of the present invention include semiconductor electronic components such as LSIs and semiconductor chips, and substrates of wiring substrates such as printed wiring boards for obtaining packages or modules in which a semiconductor electronic component or a plurality of the semiconductor electronic components are mounted to make up circuits. As the objects to be plated, those in which a required conductive bonding portion (pad) is patterned on the surface thereof, if necessary, by photolithography or the like are used.

(Formation of Undermetal)

As the object to be plated, it is also possible to use a substrate formed with a pattern of a conductive bonding portion, on the surface of which a film of one or more undermetals selected from the group consisting of Ti (titanium), Ni (nickel), Cu (copper), Au (gold), Sn (tin), Ag (silver), Cr (chromium), Pd (palladium), Pt (platinum), W (tungsten), Co (cobalt), TiW (titanium-tungsten), NiP (nickel-phosphorus), NiB (nickel-boron), NiCo (nickel-cobalt), and NiV (nickel-vanadium), if necessary, is formed (for example, a substrate having an undermetal layer). These undermetals may be used alone or two or more may be used in combination. As the film forming method, an applicable method may be appropriately selected from vapor deposition, PVD, a plating method, and the like. The thickness of the film to be formed may be appropriately set in a range of 0.01 to 10 µm for each.

(Formation of Conductive Post)

It is also possible to use, as the object to be plated, a layer of undermetal, on which columnar conductive posts which are provided for the purpose of preventing short circuiting during mounting (during heating and reflowing) by arranging the solder alloy of the conductive bonding material at narrow intervals (narrow pitch) along with the miniaturization of integrated circuits, are formed. The columnar post material may be appropriately selected from conductive metals such as Cu, Ag, and Ni. Formation of the columnar post may be performed by appropriately selecting and using an applicable method from PVD, plating, and the like. The height of the columnar post is usually in a range of 1 to 200 µm, and may be appropriately set as needed.

(Micro Core Material)

As described below, it is also possible to use, as the object to be plated, any micro core material, whose size is 1 mm or less, and which is selected from the group consisting of a micro metal ball, a micro resin ball having a coating layer of conductive metal, a micro resin ball having a coating layer of solder alloy, and a micro pin member. By using these as the object to be plated, it is possible to obtain a bonding member of micro member.

A micro ball which is used as a core ball of conductive bonding material of a micro ball mounting type such as a ball grid array (hereinafter, referred to as a BGA) can also be used as the object to be plated. As the micro ball, which has a diameter of 1 mm or less, a micro metal ball or a micro resin ball can be used. In particular, micro resin balls are used as a core-ball material which is effective for weight reduction and thermal stress relaxation (elastic deformability) of electronic circuit parts.

As the micro metal ball, for example, any conductive metal sphere such as of Cu, Ni—Co—Fe alloy, or Ni—Fe alloy, which has a diameter of 0.05 to 1.0 mm, can be used. Further, as needed, it is also possible to use a micro metal ball which is provided with a conductive coating such as Ni, Cu, or solder, which has a thickness of 0.1 to 30 µm, on the surface thereof.

As the micro resin ball, it is possible to use, for example, any of general resins such as acrylic resin, polypropylene resin, vinyl chloride resin, polyphenylene sulfide, and divinylbenzene crosslinked polymer, which can be used to form a micro ball having a diameter of 0.05 to 1.0 mm. Since these micro resin balls are non-conductive, those whose surface is coated with a conductive metal or alloy such as Ni, Cu, or solder of about 0.5 to 5.0 µm by electroless plating or the like are used.

Further, the micro core material is not limited to a ball shape, and a micro pin member with a columnar shape, a prismatic shape, a weight shape, and those shapes with corners thereof being chamfered can also be used. As the micro pin member, a micro metal pin or a micro resin pin having the same material and size as the above-mentioned micro metal ball or micro resin ball can be used. In the case of the micro pin member, it is assumed that the smallest side corresponds to the diameter of the micro metal ball or the micro resin ball.

[Surface Washing/Drying of Object to be Plated]

In the production method of the present invention, surface washing/drying of the object to be plated may be performed before the plating step.

The purpose of surface washing of the object to be plated is to remove and clean the deposits on the surface of the object to be plated, and a solvent capable of removing the deposits is selected and used. For example, examples of an organic solvent include lower alcohols such as methanol, ethanol, and isopropyl alcohol, and ketones such as acetone, methyl ethyl ketone (MEK), and methyl isobutyl ketone (MIBK). Examples of an aqueous solvent include a combined use of ammonia, an organic amine compound, etc. and a hydrogen peroxide solution, and an aqueous solution to which an anionic, cationic, or nonionic surfactant is added. Of these solvents, appropriate ones are selected and used in consideration of not attacking the material of the object to be plated.

The surface washing of the object to be plated is performed by a method such as immersion in these solvents or shower washing with the solvents within a range of room temperature to 100° C. After washing with the solvent, the solvent component adhering to the surface may be washed with water to clean the surface. Next, regarding the drying of the object to be plated, heat drying or ventilation drying may be performed in a range of room temperature to 100° C. It is also possible to omit the drying step and proceed to the following plating step.

[Plating Step]

The plating step is a step of performing a plating process including at least Bi plating and In plating and forming, on an object to be plated, a plating layer containing Bi: 46 mass % or more and 72 mass % or less, In: 26 mass %, or more and 54 mass %, or less, and Sn: 2 mass % or less when a total amount of Bi, In, and Sn is 100 mass %.

The plating method may be either electrolytic plating or electroless plating, but electrolytic plating is preferable in consideration of the required plating time and productivity.

Taking an example of electrolytic plating to describe a usable plating apparatus, it is possible to use a plating apparatus that can set an object to be plated on the negative electrode by using a soluble anode or an insoluble anode as the positive electrode by using a plating tank, which is made of a material having corrosion resistance to each plating solution to be used, and which is provided with a stirring function such as blade stirring, shaking, and squeegee stirring, and a rectifier capable of controlling the current value within a predetermined range.

The plating process that is performed in the plating step at least includes Bi plating and In plating. A composition of the plating layer can be controlled by adjusting a concentration of each plating solution and a plating processing time so that a plating layer formed in each plating process assumes a desired thickness.

When the plating layer to be formed does not contain Sn, Bi plating and In plating are performed and a plating layer (Bi—In-based plating layer) containing Bi and In can be formed.

When the plating layer to be formed contains Sn, Sn plating is performed in addition to Bi plating and In plating and a plating layer (Bi—In—Sn-based plating layer) containing Bi, In, and Sn can be formed. In addition, a plating layer containing Bi, In, and Sn may be formed by performing Bi plating with a Bi plating solution containing Sn ions (a Bi—Sn composite plating solution) or performing In plating containing Sn ions. When a Sn content in the final plating layer is small and reproducibility of Sn concentration adjustment by Sn single plating is poor, the reproducibility is improved by first forming a Bi—Sn composite plating layer using a Bi—Sn composite plating solution containing a small amount of Sn and then performing In plating to be described later on the Bi—Sn composite plating layer to form a Sn—Bi—In-based low melting-point plating layer.

In the plating step, the plating process is preferably performed so as to form a plating layer containing Bi: 46 to 51 mass % and In: 49 to 54 mass % and not containing Sn or a plating layer containing Bi: 46 to 51 mass %, In: 47 to 53.9 mass %, and Sn: 0.1 to 2 mass %. In addition, the plating process is preferably performed so as to form a plating layer containing Bi: 63 to 72 mass %, and In: 28 to 37 mass % and not containing Sn or a plating layer containing Bi: 63 to 72 mass %, In: 26 to 36.9 mass %, and Sn: 0.1 to 2 mass %. Accordingly, since a plating layer with a sharp temperature range of a melting point in an endothermic profile in DSC measurement is formed, an effect of reducing time for heating and reflowing at the time of mounting and an effect of improving bonding reliability can be expected.

The method of each plating process will be illustrated below.

(Bi Plating)

Bi plating is a plating process performed by using a plating solution or the like containing Bi as a main component for plating an object to be plated. As the Bi plating solution, a commercially available one may be used, and examples thereof include a Bi plating solution manufactured by Ishihara Chemical Co., Ltd. The plating conditions may be arbitrary set, for example, under stirring using blade stirring, shaking, squeegee stirring, etc., within the ranges of temperature of 5 to 50° C., Bi ion concentration of 1 to 70 g/L in the plating solution, and current density of 0.1 to 20.0 A/dm$^2$. The Bi plating amount can be controlled by the plating processing time (immersion time in plating solution) under the set conditions. In addition, Bi/Sn plating that is performed using a Bi—Sn composite plating solution may be performed as the Bi plating.

(In Plating)

In plating is a plating process performed by using a plating solution or the like containing In as a main component for plating an object to be plated. As the In plating solution, a commercially available one may be used, and examples thereof include In plating solutions manufactured by Ishihara Chemical Co., Ltd. and EEJA (Electroplating Engineers of Japan) Ltd. The plating conditions may be arbitrary set, for example, under stirring using blade stirring, shaking, squeegee stirring, etc., within the ranges of temperature of 5 to 50° C., In ion concentration of 1 to 70 g/L in the plating solution, and current density of 0.1 to 20.0 A/dm$^2$. The In plating amount can be controlled by the plating processing time (immersion time in plating solution) under the set conditions. In addition, In/Sn plating that is performed using an In—Sn composite plating solution may be performed as the In plating.

(Sn Plating)

As described earlier, when the plating layer to be formed contains Sn, Sn plating may be performed in addition to Bi plating and In plating.

Sn plating is a plating process performed by using a plating solution or the like containing Sn as a main component for plating an object to be plated. As the Sn plating solution, a commercially available one may be used, and examples thereof include a Sn plating solution manufactured by Ishihara Chemical Co., Ltd. The plating conditions may be arbitrary set, for example, under stirring using blade stirring, shaking, squeegee stirring, etc., within the ranges of temperature of 5 to 50° C., Sn ion concentration of 1 to 70 g/L in the plating solution, and current density of 0.1 to 20.0 A/dm$^2$. The Sn plating amount can be controlled by the plating processing time (immersion time in plating solution) under the set conditions.

For the Bi plating, In plating, and Sn plating, a composite plating solution containing other plating components, such as optionally used mixed components, may be used. In a plating composition such as a plating solution, the total amount of other plating components with respect to the main component (total amount of other plating components (g/L)/ main component (g/L)) is preferably 50 mass % or less, more preferably 30 mass % or less, and more preferably 20 mass % or less. For example, a Bi—Cu composite plating solution in which Cu, which is an arbitrary mixed component, is mixed with Bi plating or a Bi—Ag composite plating solution in which Ag is mixed with Bi plating may be used as Bi plating because they contain Bi as a main component. The same applies to In plating and Sn plating.

In addition, as described earlier, a composite plating solution containing Sn ions may be used for Bi plating and In plating. The Bi—Sn composite plating solution or the In—Sn composite plating solution may also further contain the mixed components described earlier or the like. For example, a Bi—Sn—Cu composite plating solution in which Sn and Cu are mixed may be used as a Bi plating solution or a Bi—Sn—Ag composite plating solution in which Sn and Ag are mixed may be used as a Bi plating solution. The same applies to the In plating solution.

(Addition of Trace Metal)

One or more mixed components selected from the group consisting of Ag, Cu, Ni, Zn, and Sb may be added within a range where the melting point of a plating layer obtained as needed does not exceed 111° C. for the purpose of improving the physical properties such as smoothness and adhesiveness of the film of the plating layer. The mixed components can be added such that the percentage of the total mass of the mixed components in the total mass of the plating layer (total mass of the mixed components/total mass of the plating layer) is 0.001 to 3.0 mass %. The percentage of the total mass of the mixed components in the plating layer may be 0.005 mass % or more, 0.01 mass % or more, 0.05 mass % or more, and 0.1 mass % or more. Moreover, the percentage of the total mass of the mixed components in the plating layer may be 2.5 mass % or less, 2.0 mass % or less, 1.5 mass % or less, or 1.0 mass % or less.

As described earlier, examples of the method of adding these specific mixed components include a method of adding the mixed components to a plating solution of any of Bi, In, and Sn and introducing the mixed components into a coating film of Bi, In, or Sn such that the content of the mixed components in the plating layer becomes a predetermined amount. It is also possible to use a plating solution containing a mixed component itself as the main component to perform single plating and introduce it into the plating layer.

From the viewpoint of adjusting a precipitation potential with a complexing agent or the like to obtain alloyed plating with the mixed component (added metal), the added metal is preferably added in the Bi plating solution or the Sn plating solution. The amounts of these added metals to be added to the Bi or Sn plating solution may be appropriately selected and used in a concentration range of $1/1000$ to $1/10$ with respect to the weight concentration of Bi or Sn such that a predetermined concentration is realized in the obtained plating layer.

(Order of Plating Process)

While an order of Bi plating and In plating may be arbitrary if both Bi plating and In plating are to be performed, the plating step is preferably the plating step (A) or the plating step (B) described below:

Plating step (A): a step in which the plating process includes Bi plating and In plating and in which the In plating is performed after the Bi plating is performed Plating step (B): a step in which the plating process includes Bi plating, In plating, and Sn plating and in which the plating process to be first performed on the object to be plated is Sn plating or Bi plating, and the In plating is performed after the Sn plating and the Bi plating are performed.

When Bi plating and In plating are performed in the plating step, specifically, in order from the surface of the object to be plated, any of the orders of Bi→In and In→Bi may be possible. In order to stably form a plating layer with a predetermined composition by electrolytic plating, it is preferable to perform plating starting from the one having a high standard electrode potential and a low ionization tendency. Therefore, it is more preferable to perform plating in the order of "Bi→In".

When Sn plating is performed in addition to Bi plating and In plating in the plating step, an order of Bi plating, In plating, and Sn plating may be arbitrary. Specifically, in order from the surface of the object to be plated, any of the orders of Sn→Bi→In, Sn→In→Bi, Bi→Sn→In, Bi→In→Sn, In→Sn→Bi, and In→Bi→Sn may be possible. In order to stably form a plating layer with a predetermined composition by electrolytic plating, it is preferable to perform plating starting from the one having a high standard electrode potential and a low ionization tendency. Therefore, it is more preferable to perform laminated plating in the order of "BiSn→In" or "Sn→Bi→In".

With reference to the standard hydrogen electrode at 25° C. and $10^5$ pascal (Pa), the standard electrode potentials are Bi=0.317 V, Sn=−0.138 V, and In=−0.338 V. If the In plating with the lowest potential is performed before the Bi plating or the Sn plating, since In is readily ionized and eluted in an electrolytic plating bath during a plating operation of a next component, the concentration in the plating layer tends to become lower than the set condition. Therefore, it is preferable that the In plating is the final plating performed after the Bi plating or after the Bi plating and the Sn plating.

(Plating Layer)

A plating layer is formed by sequentially performing at least Bi plating and In plating. When Sn is not used, the plating layer to be formed is a Bi—In-based plating layer, but when Sn is used, the plating layer to be formed is a Bi—In—Sn-based plating layer.

A Bi—In-based plating layer is a plating layer that is formed by sequentially performing Bi plating and In plating. Due to the diffusion of In into a Bi layer and the formation of an alloy layer during the process of forming the plating layer, a Bi—In-based plating layer with a melting point being 86 to 111° C., which is significantly lower than individual melting points of Bi (melting point: 272° C.) and In (melting point: 157° C.), is obtained. The Bi—In-based plating layer may be configured such that Bi and In are uniformly distributed or configured such that Bi and In are non-uniformly distributed. In addition, a laminated body may be created and configured so as to have a plurality of BiIn layers respectively having different concentrations of Bi and In.

A Bi—In—Sn-based plating layer is formed by sequentially performing Bi plating, In plating, and Sn plating or by sequentially performing Bi/Sn plating using a Bi—Sn composite plating solution and In plating. Due to the diffusion of In into a Bi layer and/or a Sn layer and the formation of an alloy layer or the diffusion of In into a Bi layer that also contains Sn and the formation of an alloy layer during the process of forming the plating layer, a Bi—In—Sn-based plating layer with a melting point being 86 to 111° C., which is significantly lower than individual melting points of Bi (melting point: 272° C.), In (melting point: 157° C.), and Sn (melting point: 232° C.) is obtained. The Bi—In—Sn-based plating layer may be configured such that Bi, In, and Sn are uniformly distributed or configured such that Bi, In, and Sn are non-uniformly distributed. In addition, a laminated body may be created and configured so as to have a plurality of layers with different concentrations of Bi, In, and Sn. For example, the Bi—In—Sn-based plating layer may be configured to have a BiIn layer in which In is diffused into a Bi layer and a SnIn layer in which In is diffused into a Sn layer. The Bi—In—Sn-based plating layer may have a plurality of BiIn layers with different concentrations of Bi and In or a plurality of SnIn layers with different concentrations of Sn and In. In addition, the Bi—In—Sn-based plating layer may be configured to have a BiInSn layer in which In and Sn are diffused in a Bi layer or a plurality of BiInSn layers with different concentrations of Bi, In, and Sn.

When the plating layer is a laminated body, the number of plated lamination is not particularly limited, and it is sufficient that there a plurality of two or more layers having different concentrations of Bi and In or different concentrations of Bi, In, and Sn. For the purpose of preventing alloying and diffusion of both components due to the interaction between the object to be plated and the plating components, it is possible to form layers having different concentrations of the two components or three components described above, thereby laminating three layers, four layers, five layers, or the like.

The concentration of each element in the plating layer can be determined by peeling the plating layer from the object to be plated, dissolving it with acid, and then quantitatively analyzing it with a high-frequency inductively coupled plasma-emission spectrometer.

While the plating layer contains Bi and In or Bi, In, and Sn as main components, in addition to such metal elements, the plating layer may contain impurities that are inevitably contained in the raw material and the production step. Examples of such impurities include Fe (iron) and C (carbon). Further, as described above, the plating layer may contain any additive element as a mixed component.

For example, the Bi—In-based plating layer may be made up of Bi, In, a mixed component, and inevitably-contained impurities. The Bi—In—Sn-based plating layer may be made up of Bi, In, Sn, a mixed component, and inevitably-contained impurities.

In addition, it is preferable to reduce the mixed amount of Pb for using as Pb-free, and the concentration of Pb in the plating layer is preferably 0.1 mass % or less, more preferably 0.05 mass % or less, and more preferably 0.01 mass %, or less. It is more preferable that Pb is not more than a lower limit of detection.

In the case of the Bi—In-based plating layer, the percentage of the total amount of Bi and In with respect to the plating layer (total mass of Bi and In/whole mass of plating layer) is preferably 70 mass % or more, more preferably 80 mass % or more, further preferably 90 mass % or more, and particularly preferably 95 mass % or more. Moreover, it may be 97 mass % or more, 98 mass % or more, and 99 mass % or more.

In the case of the Bi—In—Sn-based plating layer, the percentage of the total amount of Bi, In, and Sn with respect to the plating layer (total mass of Bi, In, and Sn/whole mass of plating layer) is preferably 70 mass % or more, more preferably 80 mass % or more, further preferably 90 mass % or more, and particularly preferably 95 mass % or more. Moreover, it may be 97 mass % or more, 98 mass % or more, and 99 mass % or more.

(Layer of Bi)

A layer of Bi obtained by Bi plating is a layer containing Bi. The layer of Bi contains Bi as the main component excluding In, and the Bi concentration in the elements excluding In in this layer is preferably 70 mass % or more, more preferably 80 mass % or more, and even more preferably 90 mass % or more. This layer of Bi can be obtained by Bi plating.

In addition, when a Bi—Sn composite plating solution is used, the layer of Bi obtained by Bi plating contains Bi as the main component excluding In and Sn, and the Bi concentration in the elements excluding In and Sn in this layer is preferably 70 mass % or more, more preferably 80 mass % or more, and even more preferably 90 mass % or more.

Further, the layer of Bi may be a BiIn layer including In. This BiIn layer contains Bi and In as the main components of the layer, and the total of Bi and In may be 70 mass % or more, 80 mass % or more, 90 mass % or more, and 95 mass % or more in the layer. The BiIn layer contains both of them, and the mass ratio of Bi:In is 1:99 to 99:1, and may also be 5:95 to 95:5, 10:90 to 90:10, 20:80 to 80:20, and so on.

Further, the layer of Bi may be a BiInSn layer including Sn and In. This BiInSn layer contains Bi, In, and Sn as the main components of the layer, and the total of Bi, In, and Sn may be 70 mass % or more, 80 mass % or more, 90 mass % or more, or 95 mass % or more in the layer.

(Layer of in)

Since In contained in the laminated plating layer by In plating easily diffuses into the layer of Sn and the layer of Bi during the plating process, it is difficult to form a single layer containing In alone as the main component, and may be formed in the form of a SnIn alloy, a BiIn alloy, or a BiInSn alloy.

(Layer of Sn)

A layer of Sn obtained by Sn plating is a layer containing Sn. The layer of Sn contains Sn as the main component excluding In, and the Sn concentration in the elements excluding In in this layer is preferably 70 mass % or more, more preferably 80 mass % or more, and even more preferably 90 mass % or more. This layer of Sn can be obtained by Sn plating.

Further, the layer of Sn may be a SnIn layer also including In. This SnIn layer contains Sn and In as the main components of the layer, and the total of Sn and In may be 70 mass % or more, 80 mass % or more, 90 mass % or more, and 95 mass % or more in the layer. The SnIn layer contains both of them, and the mass ratio of Sn:In is 0.1:99.9 to 99.9:0.1, and may also be 1:99 to 99:1, 10:90 to 90:10, 20:80 to 80:20, and so on.

Further, the layer of Sn may be a BiInSn layer including Bi and In. This BiInSn layer contains Bi, In, and Sn as the main components of the layer, and the total of Bi, In, and Sn may be 70 mass % or more, 80 mass %, or more, 90 mass %, and 95 mass % or more in the layer.

(Water Washing/Drying after Each Plating Step)

The purpose of washing with water after each plating step is to remove the plating solution adhering to the surface of the object to be plated when it is pulled up from the plating bath, and it is cleaned by immersing it in water or washing it with water by a water shower. Subsequent drying may be performed at a temperature lower than the melting point of the plating layer. Considering the melting point of the plating layer, if the purpose is to remove moisture, the temperature may be usually set in a range of room temperature to 100° C. appropriately, to perform heat drying or ventilation drying. If there is no problem even if there is residual moisture in the next step, it is possible to skip the drying step and proceed to the next step.

The plating layer may be produced using a substrate or the like as an object to be plated and used as a bonding member in a mounting step in a state of the plating layer disposed on the object to be plated.

Further, this may be used in the mounting step by being subjected to low melting-point solder alloy bumping or micro member mounting bumping to be described later. The plating layer may be separated from the object to be plated as appropriate and used as a bonding member.

[Bumping Step]

As described above, the bonding member of the present invention can be configured so as to have a bump such as a solder alloy bump or a micro member mounting-type bump. In this case, the production method of the present invention may have a bumping step after the plating step. The bumping step is a step of heating and reflowing the plating layer disposed on the conductive bonding portion to form a solder alloy bump, or a step of heating and reflowing a micro member (micro core material coated with a plating layer) disposed on the conductive bonding portion to form a micro member mounting-type bump. The heating and reflowing are performed in a reducing atmosphere. For example, the heating and reflowing can be performed in a formic acid gas atmosphere as will be described later. Since the plating layer formed in the plating step has a low melting point, it may be subjected to heating and reflowing in a low temperature region of 105 to 140° C. to form a bump.

Generally, in the formation of a bump, such as a solder alloy bump, by heating and reflowing, the alloy is required to have physical properties such as a uniform composition and a uniform spherical or hemispherical shape without surface unevenness. Further, as the physical properties at the time of mounting, the bonding strength with the object to be plated of 3 mg/$\mu m^2$ or more, heat cycle durability, and the like are required. Preferably, the bonding strength with the object to be plated is 3.3 mg/$\mu m^2$ or more. Factors that adversely affect these required physical properties include basic physical properties of the solder alloy itself, natural oxide films of the alloy component before heating and reflowing, and adhesion and mixing of impurities.

It is preferable to use a "formic acid gas reduction method" for the purpose of removing the natural oxide film at a low temperature at the time of heating and reflowing. As a method for removing a natural oxide film, generally, methods shown below are available: the "formic acid gas reduction method" and the "hydrogen gas reduction method". Since the latter causes reduction reaction at 230° C. or more, and the former causes reduction reaction at around 150° C., it is preferable to apply the "formic acid gas reduction method" which can be adapted to a low temperature region and which is advantageous in terms of safety, reliability, and cost. That is, it is preferable that the bumping step is performed in a formic acid gas atmosphere.

Formic acid gas reduction method: MeO+ HCOOH→Me+$CO_2$+$H_2O$

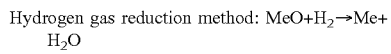
Hydrogen gas reduction method: MeO+$H_2$→Me+ $H_2O$

In the bumping step, using the "formic acid gas reduction method", the conditions may be appropriately selected according to the composition of the plating layer within the ranges of reducing agent: formic acid, pressure: 20 to 400 mbar, rate of temperature increase: 10 to 150° C./min, top temperature: 105 to 140° C., and top temperature holding time: 20 to 300 seconds. Bumps such as solder alloy bumps thus obtained are suitable for low temperature mounting because they can be bonded in a low temperature region where the heating and reflowing temperature at the time of mounting is 105 to 140° C.

Note that when heat resistance of a semiconductor element or a wiring substrate to be an object of forming the plating layer or disposing a micro member is 140° C. or more, it is also possible to perform bumping and bonding and mounting to be described later by performing heating and reflowing within a temperature range from a temperature of 140° C. or more to a heatproof temperature of the semiconductor element or the wiring substrate or less.

Depending on the object to be plated, another step may be included between the plating step and the bumping step. When the object to be plated is a substrate having a resist film, a step of removing the resist film may be included between the plating step and the bumping step. When the object to be plated is a micro core material, since a micro member in which the micro core material is coated with a plating layer is obtained by performing a plating step, the bumping step may be performed after performing a step of disposing the micro member on a substrate.

Next, more specific examples of the production method of the present invention will be described.

[Formation of Plating Layer and Solder Alloy Bump on Conductive Bonding Portion]

A method for producing a bonding member, in which a plating layer or a solder alloy bump made of a low melting-point alloy is formed on a conductive bonding portion of a substrate formed with a pattern of the conductive bonding portion, will be described.

When forming a plating layer on the conductive bonding portion, the production method of the present invention includes a plating step and a resist film removing step. Further, when forming a solder alloy bump on the conductive bonding portion, the production method of the present invention includes a plating step, a resist film removing step, and a bumping step.

(Plating Step)

In the plating step, a plating layer is formed on the conductive bonding portion. As the object to be plated, a substrate having a patterned conductive bonding portion, and a resist film (hereinafter, may be referred to as a "resist" or a "resist pattern") provided with opening through which the conductive bonding portion is exposed is used. The method of the plating step is as described above.

(Resist Film Removing Step)

By performing a resist film removing step after the plating step, a bonding member, in which a plating layer made of a low melting-point alloy is formed as a bonding portion, is obtained on the conductive bonding portion.

The resist film removing step is a step performed after the plating step, and is a step of removing the resist film provided on the substrate.

The removal of the resist pattern can be performed by using a known wet method such as immersion or shower washing in a chemical solution capable of removing resist without attacking the plating layer, or a known dry method such as ashing treatment with oxygen plasma.

The chemical solution used in the wet method, examples of which include an organic solvent whose main component is dimethyl sulfoxide, etc., an aqueous solvent such as potassium hydroxide, and the like, may be appropriately selected considering the removability of the resist material and the durability of the plated precipitate.

After the resist is removed with the chemical solution, the object to be plated is washed by immersing in water or by water shower to clean it, and then subjected to heat drying or ventilation drying in a range of the room temperature to 100° C.

(Bumping Step)

After the resist film removing step, by heating and reflowing the plating layer formed on the conductive bonding portion, a solder alloy bump made of a low melting-point alloy is formed as a bonding portion on the conductive bonding portion. The bumping process is as described above.

A case where the plating process is performed in the order of Bi plating and In plating in the plating step will be described as an example. By performing each step in the order of "surface washing/drying of the object to be plated→Bi plating→water washing/drying→In plating→water washing/drying→resist removal→water washing/drying-→solder alloy bumping (heating and reflowing)", a bonding member formed with a solder alloy bump made of a Bi—In-based low melting-point alloy is obtained on a conductive bonding portion of a substrate formed with a pattern of the conductive bonding portion.

In addition, a case where the plating process is performed in the order of Sn plating, Bi plating, and In plating will be described as an example. By performing each step in the order of "surface washing/drying of the object to be plated→Sn plating→water washing/drying→Bi plating→water washing/drying→In plating→water washing/drying→resist removal→water washing/drying→solder alloy bumping (heating and reflowing)", a bonding member formed with a solder alloy bump made of a Bi—In—Sn-based low melting-point alloy is obtained on a conductive bonding portion of a substrate formed with a pattern of the conductive bonding portion.

So far, the method for producing a plating layer and a solder alloy bump on a conductive bonding portion by using the production method of the present invention has been described.

Also, in a similar manner, by using a substrate in which an undermetal layer and/or a conductive post is formed on the conductive bonding portion, it is possible to form a plating layer or a solder alloy bump on the undermetal layer or the conductive post.

Accordingly, for example, a semiconductor chip or a wiring substrate formed with a pattern of a laminated plating layer or a solder alloy bump can be produced.

Conventionally, as a method for producing a solder alloy used as a conductive bonding material, the following method is named in which: each alloy component is pulverized or crushed, surface-washed and dried, and combined and mixed to obtain a predetermined composition; the mixture is heated and melted at a temperature equal to or higher than the melting point of the mixed component having the highest melting point to obtain an alloy; the alloy is taken out in a lump form and is further crushed into alloy fine particles; the alloy fine particles are compounded with flux components, etc. to obtain a solder alloy paste, etc.; and this paste is applied to the object to be plated to mount it by heating and reflowing. The bonding member of the present invention may also be produced by this production method. However, this method has many steps and the productivity is lowered, and it may be difficult to adapt to the dimensional reliability which is required as the pitch of wire bonding is narrowed along with the miniaturization of integrated circuits.

By using the production method of the present invention, steps in a conventional production method of a solder alloy can be significantly mitigated, and moreover, a conductive bonding member (conductive bonding material) can be formed by a plating method directly on a surface on which a fine pattern is formed. In addition, since dimensional reliability is high and the obtained plating layer has a low melting point of 86 to 111° C., bonding can be performed in a low temperature region where a heating and reflowing temperature is 105 to 140° C. which is suitable for low temperature mounting. From such a viewpoint, it is preferable to use a Bi—In-based plating layer or a Bi—In—Sn-based plating layer provided on a surface of an object to be plated when producing a solder alloy.

[Formation of Micro Member in which Micro Core Material is Coated with Plating Layer]

A method for producing a bonding member in which a micro core material is a micro member coated with a plating layer made of a low melting-point alloy will be described.

When forming a micro member in which a micro core material is coated with a plating layer, the production method of the present invention includes a plating step.

In the plating step, by using a micro core material as an object to be plated and performing a plating process including at least Bi plating and In plating, a micro member in which a surface of the micro core material is coated with a plating layer can be produced.

In addition, as described earlier, any one whose size is 1 mm or less and which is selected from the group consisting of a micro metal ball, a micro resin ball having a coating layer of a conductive metal, a micro resin ball having a coating layer of a solder alloy, and a micro pin member can be used as the micro core material.

As a method for plating a micro core material such as a micro metal ball, a plating process is performed at a rotation speed of about 5 to 200 rpm using an apparatus which is provided with a columnar plating tank that rotates in the circumferential direction, and in which an anode is arranged in the center of the plating tank and a cathode is arranged in the circumference of the tank so that vertical rotation with a horizontal rotational axis or tilted rotation with a tilted rotation axis are possible. Specifically, a rotary plating apparatus (barrel plating method) can be used, by which a plating solution and balls, etc. which are an object to be plated, are put in a tank, and the plating process is performed by setting the current density and the energization time so as to obtain a predetermined plating thickness, and when finished, plated balls, etc. and the plating solution are discharged from a rotary circumferential portion. Further, the rotary plating apparatuses which have been improved for plating micro metal balls and described in Japanese Patent Laid-Open No. H10-18096 and Japanese Patent Laid-Open No. H10-270836, and further, the rotary plating apparatus described in Japanese Patent Laid-Open No. H11-92994 can be used.

When forming a Bi—In-based plating layer or a Bi—In—Sn-based plating layer on the surface of a micro core material or the like, a known apparatus such as the barrel plating method (the rotary plating apparatus) described above can be used. As the plating method, plating may be performed under the same conditions as in the above described plating step. While the order of the plating process is not particularly limited, a method in which Bi plating is performed first (bottom layer) and In plating is performed last (top layer) or a method in which Sn plating or Bi plating is performed first (bottom layer) and In plating is performed last (top layer) is preferable. Further, trace metal which is similar to (Addition of trace metal) described earlier can be added for the purpose of improving the smoothness and adhesiveness of the plated film, or improving the physical properties such as preventing the balls from aggregating with each other during the plating process.

What described so far is the method for forming a Bi—In-based plating layer or a Bi—In—Sn-based plating layer on the surface of a micro metal ball, a micro resin ball, a micro pin member, or the like. In a bonding member of the micro members obtained by this method, the melting point of a laminated plating layer at the surface layer is in a low temperature region of 86 to 111° C. and may be used in a mounting step as it is. Further, this may be used in the mounting step as a low melting-point solder alloy bump of a micro member mounting type to be described later.

[Formation of Micro Member Mounting Bump]

When forming a micro member mounting bump, the production method of the present invention includes a plating step, a step of disposing the micro member on a conductive bonding portion, and a bumping step. The object to be plated is a micro core material. For example, by subjecting the micro member disposed on a conductive bonding portion of the substrate to heating and reflowing, it is possible to form a micro member mounting-type bump such as BGA. Accordingly, the low melting-point bonding member in which a micro member is mounted on a conductive bonding portion is obtained.

An example of bump formation using the above described micro member will be described. For example, a flux is applied on a conductive bonding portion such as a printed wiring board for BGA, and the micro member is disposed on the flux. Next, by performing heating and reflowing in the same manner as in the bumping step described above, it is possible to form a micro member mounting bump on the conductive bonding portion.

<Mounting of Semiconductor Electronic Circuit>

The present invention can be related to a method for mounting a semiconductor electronic circuit in which a bonding member of the present invention disposed between a wiring substrate and the surface of a semiconductor chip is subjected to heating and reflowing within a range of 105 to 140° C., thereby bonding the wiring substrate and the semiconductor chip with the bonding member of the present invention. By the method of mounting a semiconductor electronic circuit of the present invention, a semiconductor electronic circuit having the bonding member of the present invention can be made.

Specifically, it is possible to mount a semiconductor electronic circuit by performing heating and reflowing in a low temperature region with the semiconductor chip and the wiring substrate being stacked such that the wiring substrate and the surface of the semiconductor chip are in contact with each other via any one selected from the group consisting of a plating layer made of a low melting-point alloy, a solder alloy bump made of a low melting-point alloy, and a micro core material (micro member) coated with a low melting-point alloy.

The heating and reflowing at the time of mounting of a semiconductor electronic circuit can be performed in a reducing atmosphere such as formic acid in the same manner as in the heating and reflowing in the bumping step described above. Conditions such as pressure, a rate of temperature increase, a top temperature, and a top temperature holding time may be the same as the conditions for heating and reflowing in the bumping step described above.

In order to have a plating layer made of a low melting-point alloy and a bump made by heating and reflowing the plating layer express a bonding strength at the time of mounting, melting and bonding is preferably performed by heating up to a liquidus temperature. In the bonding member of the present invention, since a highest melting point (liquidus temperature) of an endothermic peak of a highest temperature of the plating layer or the bump is 86 to 111° C., bonding in a low temperature region (105 to 140° C.) can be performed even when heating up to the liquidus temperature.

Mounting of a semiconductor electronic circuit is performed, for example, by preparing a semiconductor chip on which a solder alloy bump or a plating layer is formed, stacking it on an electrode portion for connection of a wiring substrate, and subjecting them to heating and reflowing in a reducing atmosphere such as formic acid to bond both.

A semiconductor chip formed with a pattern of a plating layer or solder alloy bumps is preferably produced by the production method of the present invention using the semiconductor chip as the object to be plated. It is possible to bond a semiconductor chip with a wiring substrate by performing heating and reflowing in a reducing atmosphere with the plating layer or solder alloy bumps patterned on the semiconductor chip and the electrode portions for connection of the wiring substrate being stacked with each other.

The solder alloy bumps and the plating layer may be formed on the side of the wiring substrate. In that case, the solder alloy bumps and the plating layer are bonded to an electrode portion for connection on the semi-conductor chip side.

The wiring substrate formed with a pattern of the plating layer or solder alloy bumps is preferably produced by the production method of the present invention with the wiring substrate as the object to be plated. In this case, it is possible to bond the semiconductor chip with the wiring substrate by performing heating and reflowing in a reducing atmosphere with the plating layer or solder alloy bumps patterned on the wiring substrate and the electrode portions for connection of the semiconductor chip being stacked with each other.

The solder alloy bumps and the plating layer may be formed on both the semiconductor chip side and the wiring substrate side. In such a case, it is possible to bond both by performing heating and reflowing in a reducing atmosphere with the plating layer or solder alloy bumps patterned on the wiring substrate, and the plating layer or solder alloy bumps patterned on the semiconductor chip being stacked with each other.

Moreover, a semiconductor chip formed with a pattern of a micro member, and a wiring substrate formed with a pattern of a micro member may be used.

Further, bonding by use of a plating layer composed of a low melting-point alloy, a solder alloy bump composed of a low melting-point alloy, and a micro core material (micro member) coated with a low melting-point alloy can also be applied to soldering for other than electronic circuit boards such as semiconductor chips and wiring substrates.

Figure 2:
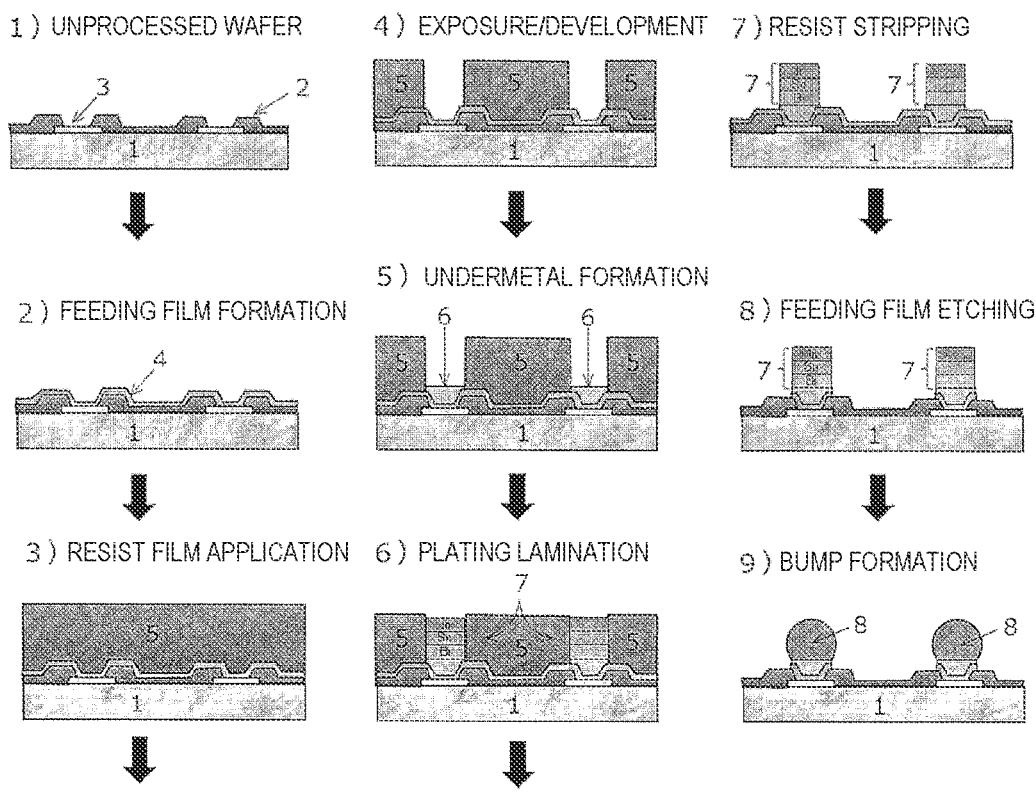
FIG. 2 is a flow diagram of a production step until a solder alloy bump according to the present invention is formed.
Figure 3:
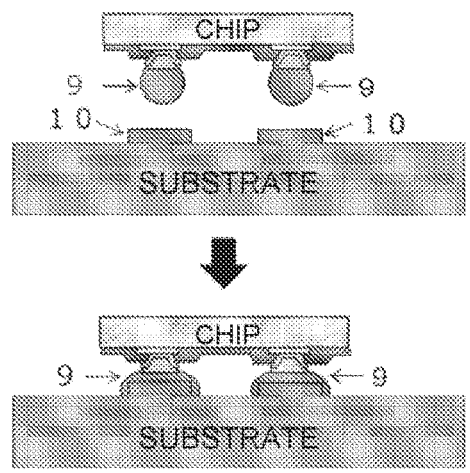
FIG. 3 is a conceptual diagram of a mounting step by a solder alloy bump according to the present invention.
Figure 4:
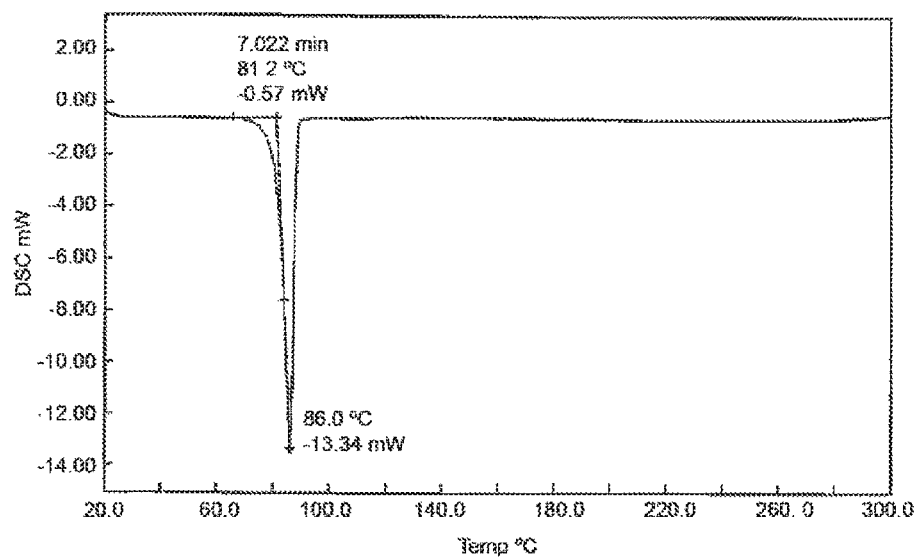
FIG. 4 shows a DSC chart of Example 1.
Figure 5:
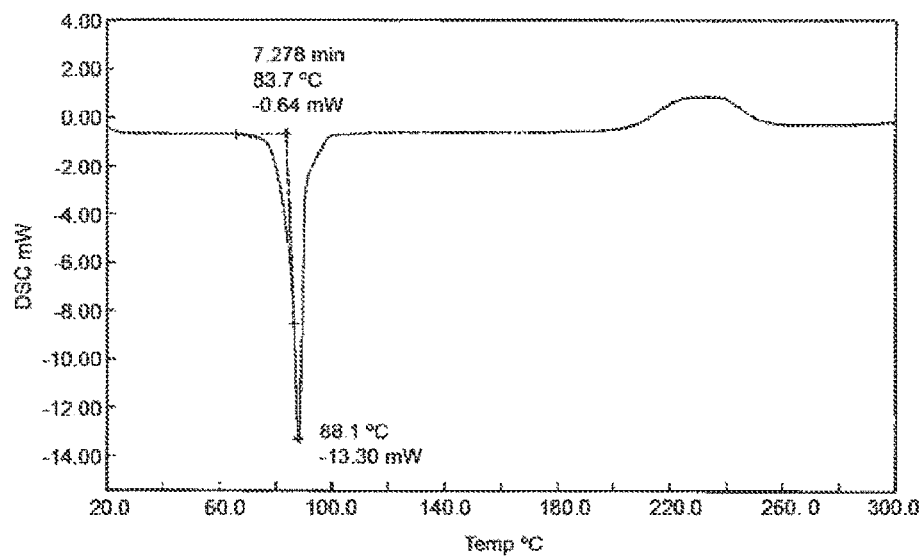
FIG. 5 shows a DSC chart of Example 2.
Figure 6:
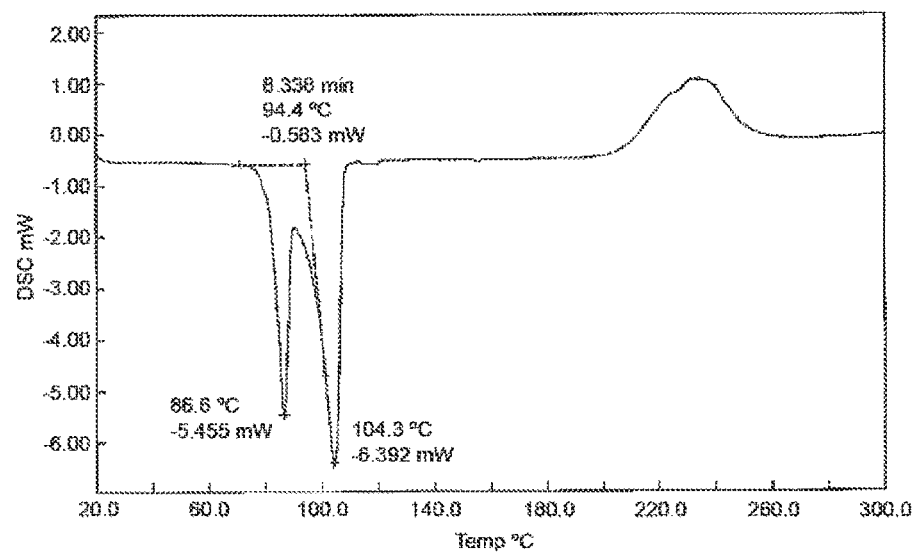
FIG. 6 shows a DSC chart of Example 4.
Figure 7:
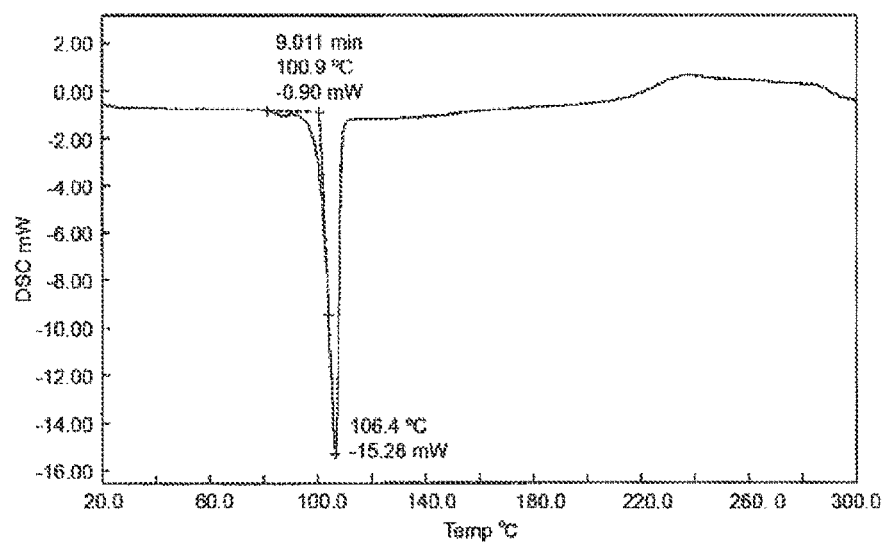
FIG. 7 shows a DSC chart of Example 5.
Figure 8:
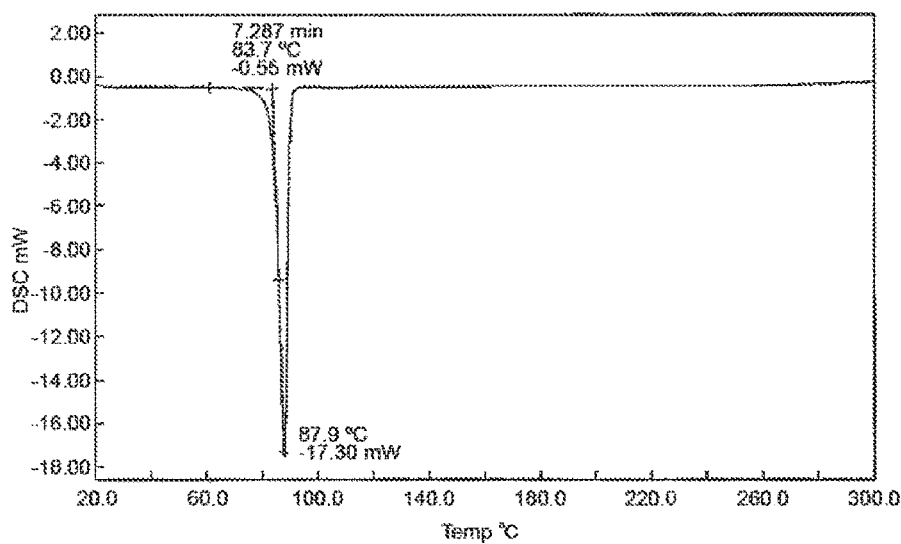
FIG. 8 shows a DSC chart of Example 6.
Figure 9:
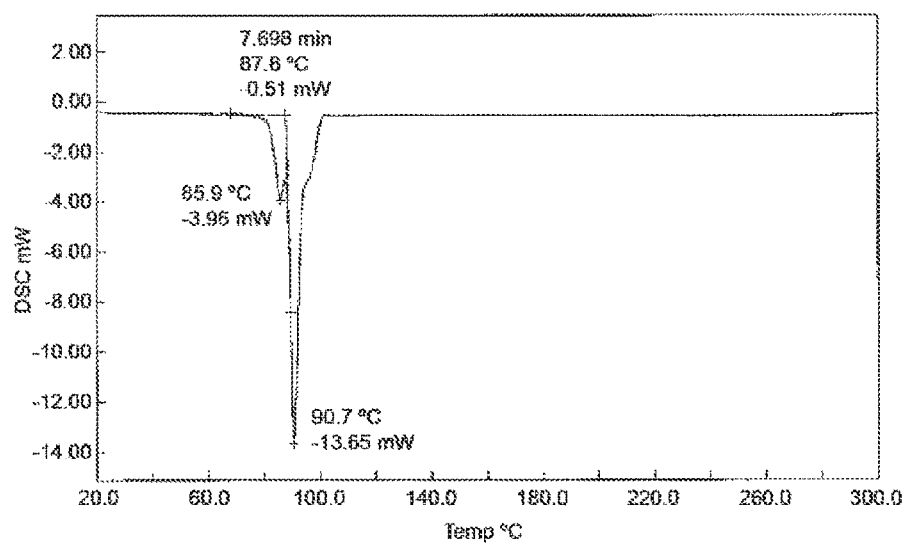
FIG. 9 shows a DSC chart of Example 8.
Figure 10:
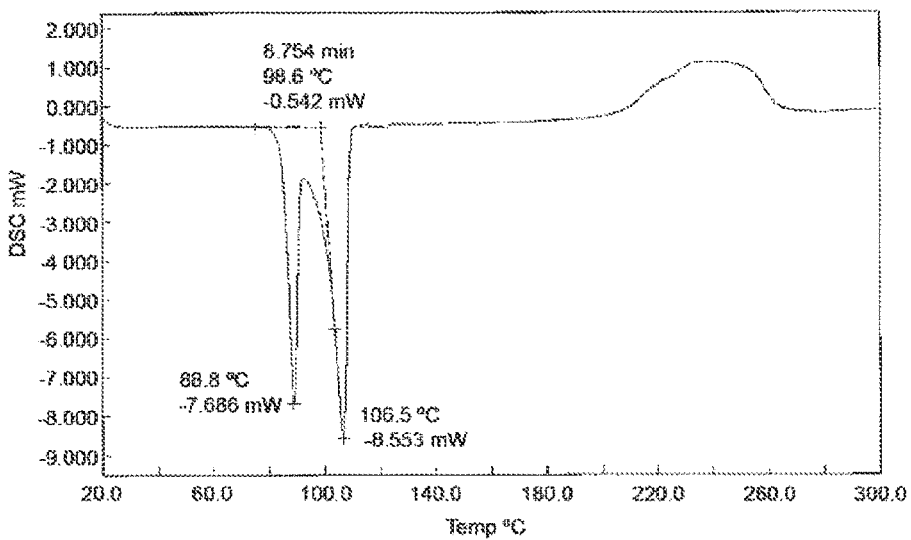
FIG. 10 shows a DSC chart of Example 10.
Figure 11:
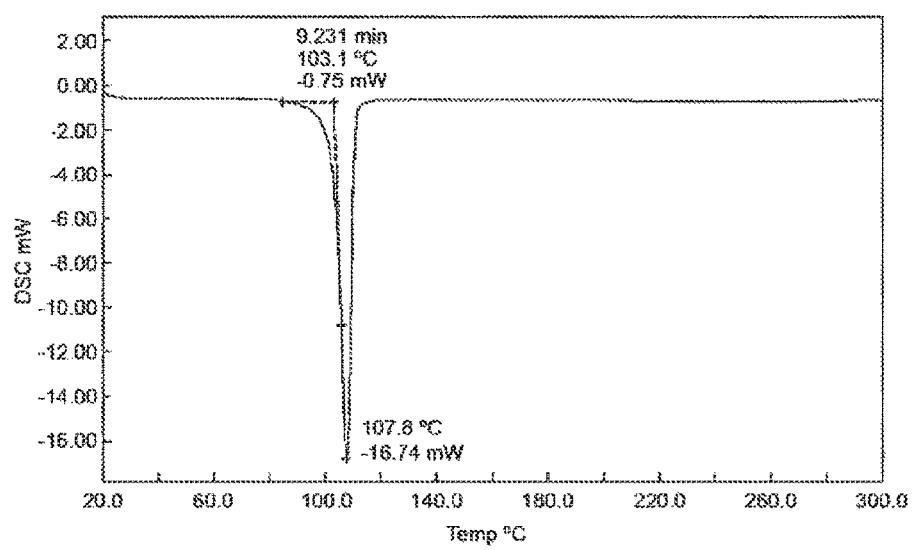
FIG. 11 shows a DSC chart of Example 12.
Figure 12:
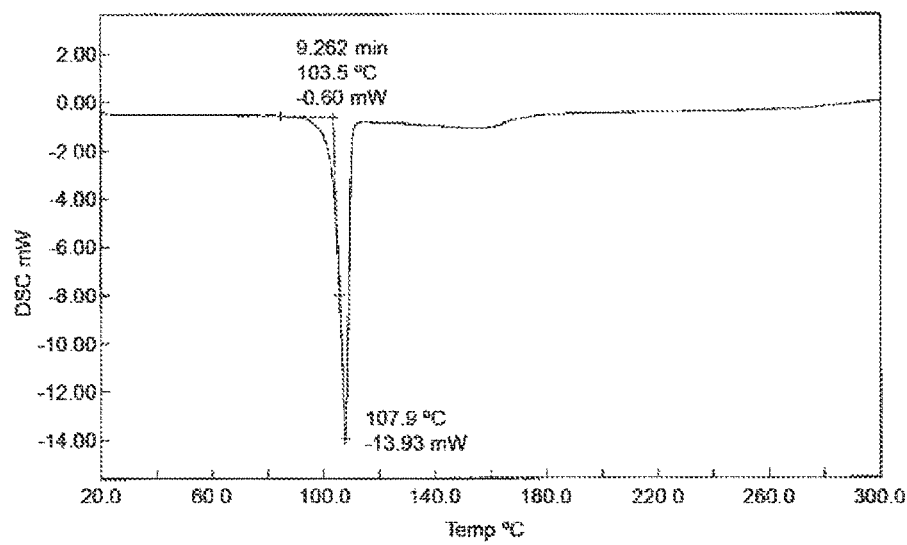
FIG. 12 shows a DSC chart of Example 13.
Figure 13:
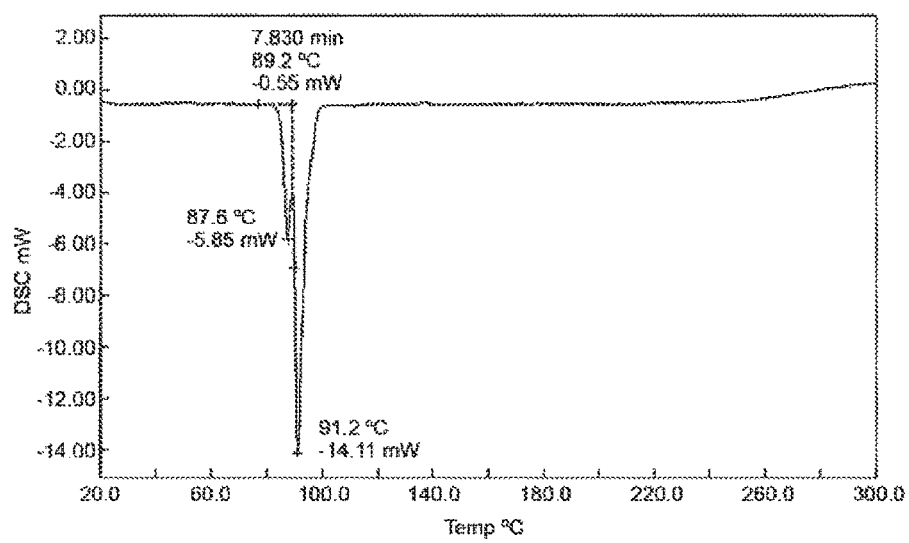
FIG. 13 shows a DSC chart of Example 14.
Figure 14:
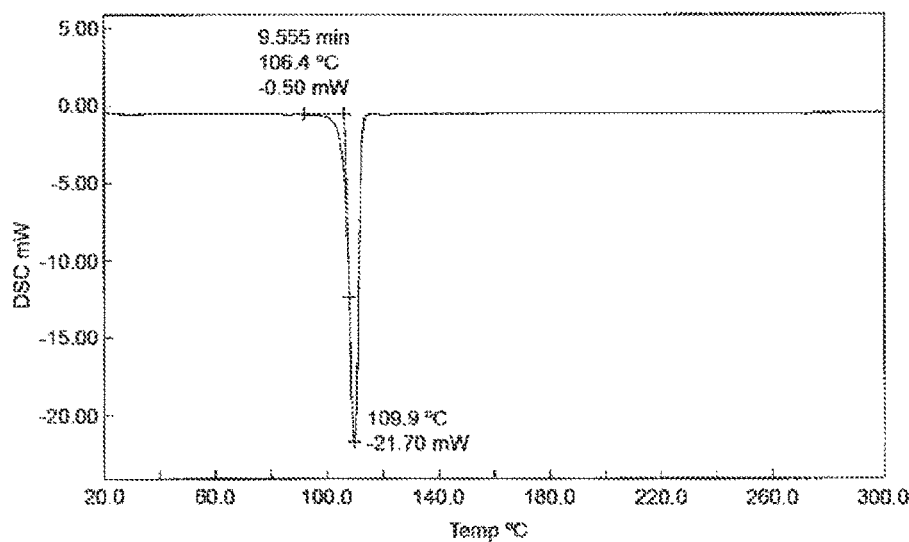
FIG. 14 shows a DSC chart of Example 17.
Figure 15:
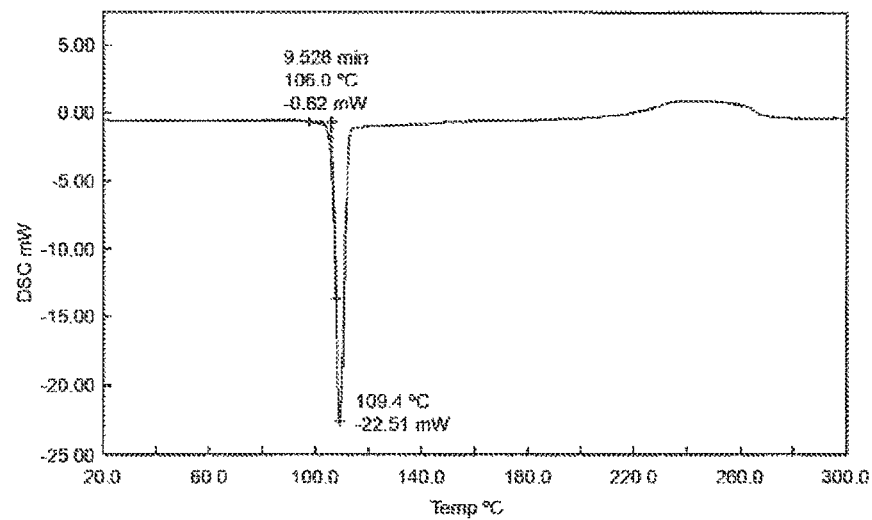
FIG. 15 shows a DSC chart of Example 18.
Figure 16:
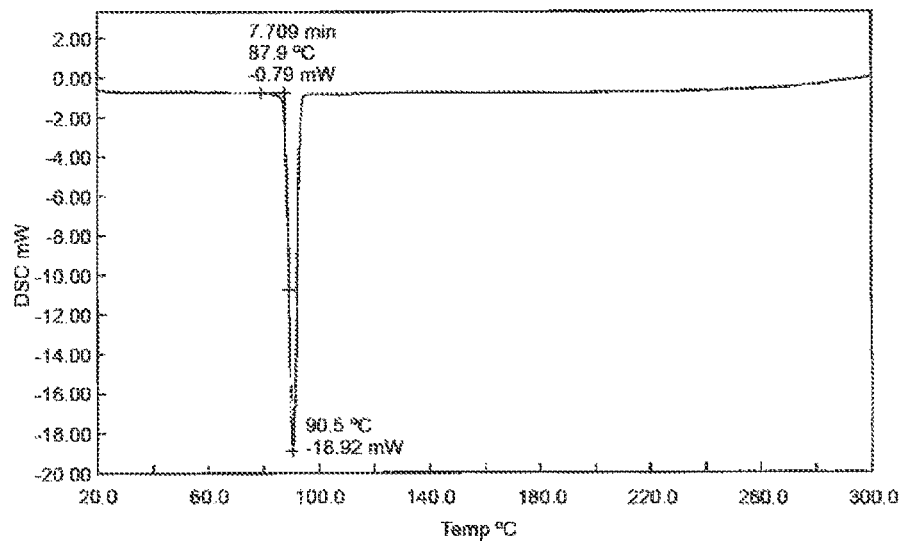
FIG. 16 shows a DSC chart of Example 19.
Figure 17:
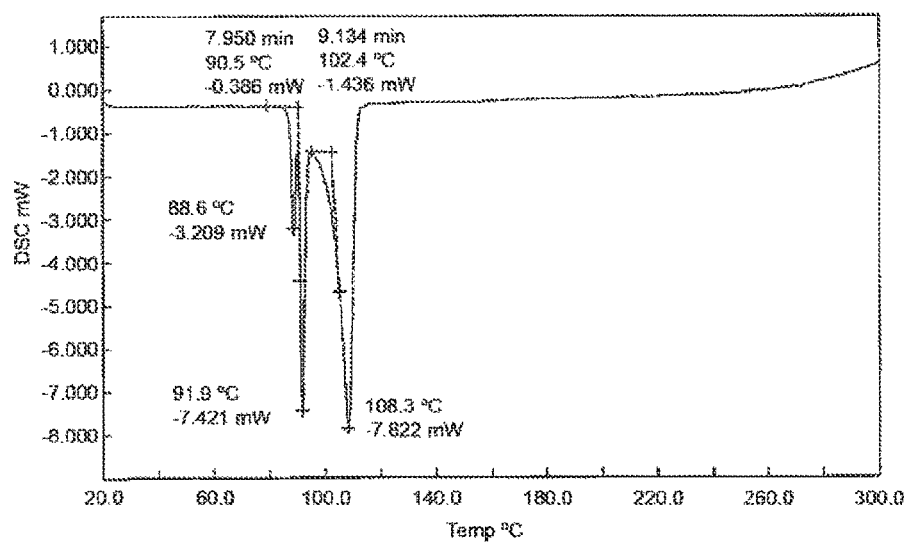
FIG. 17 shows a DSC chart of Example 21.
Figure 18:
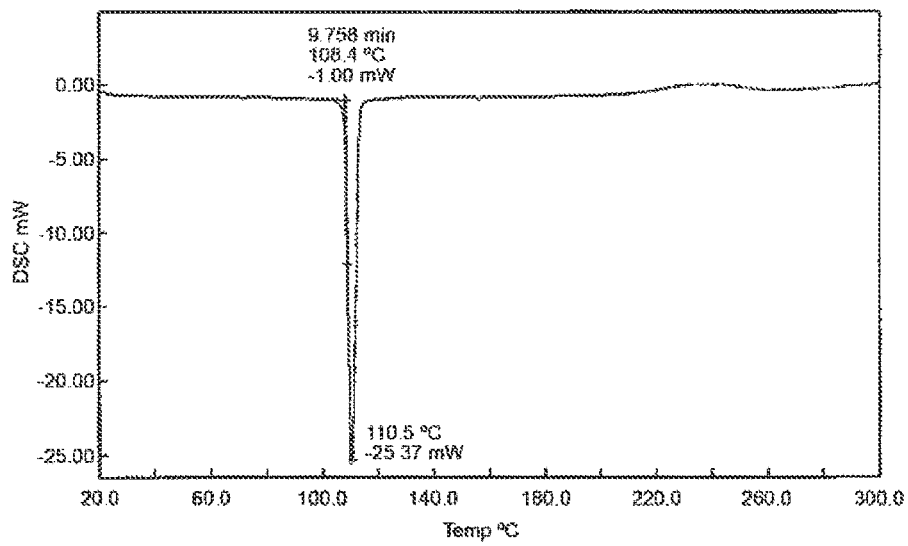
FIG. 18 shows a DSC chart of Example 23.
Figure 19:
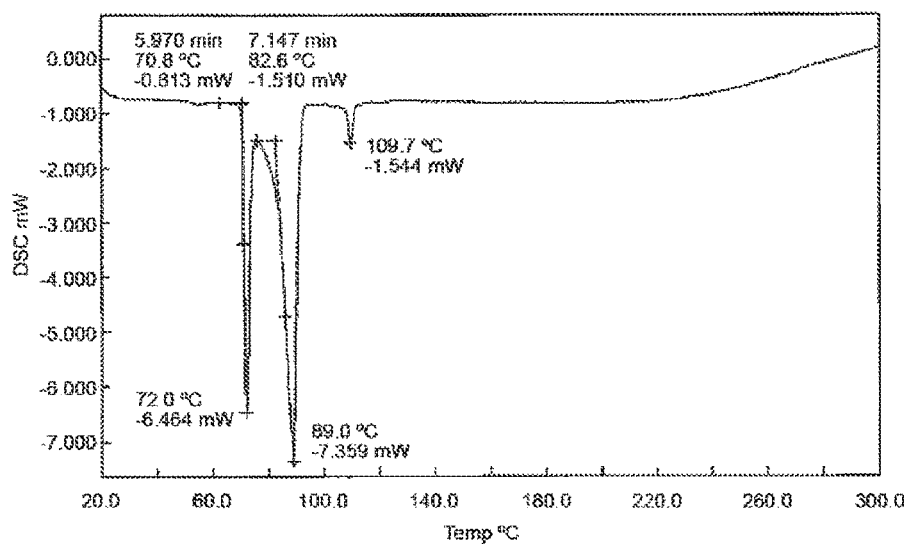
FIG. 19 shows a DSC chart of Comparative Example 1.
Figure 20:
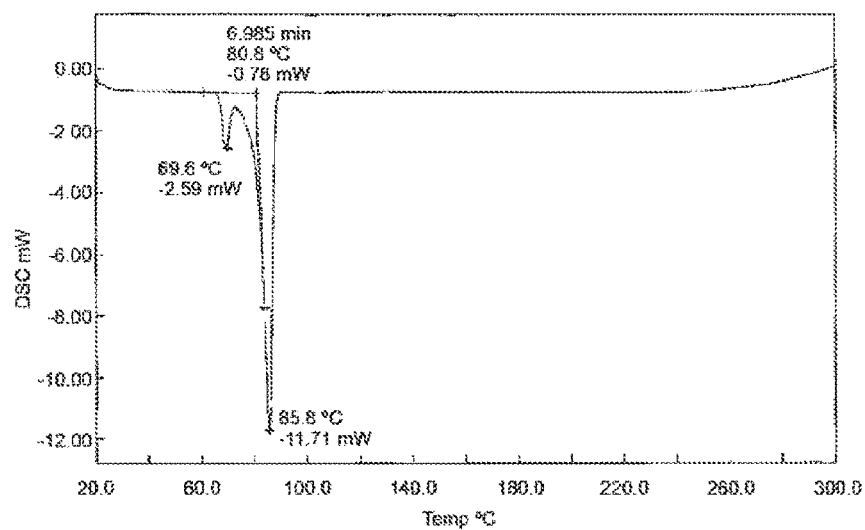
FIG. 20 shows a DSC chart of Comparative Example 2.
Figure 21:
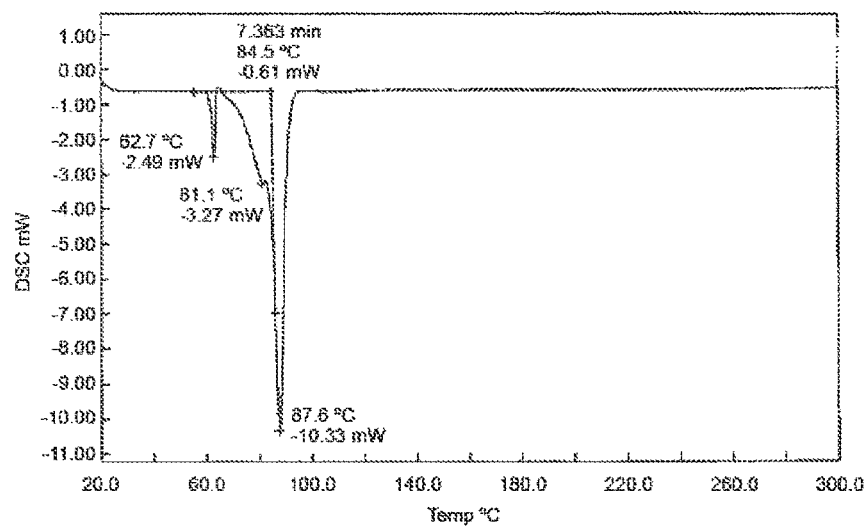
FIG. 21 shows a DSC chart of Comparative Example 3.
Figure 22:
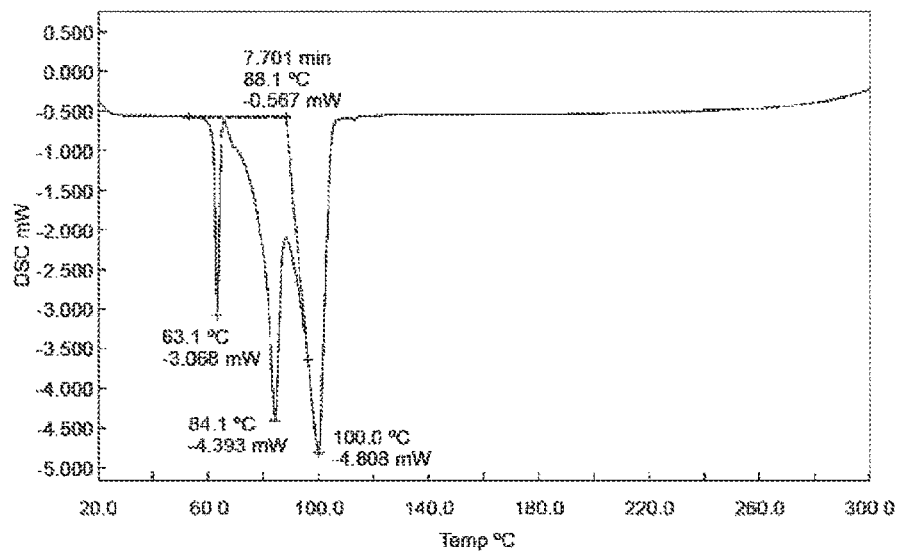
FIG. 22 shows a DSC chart of Comparative Example 5.
Figure 23:
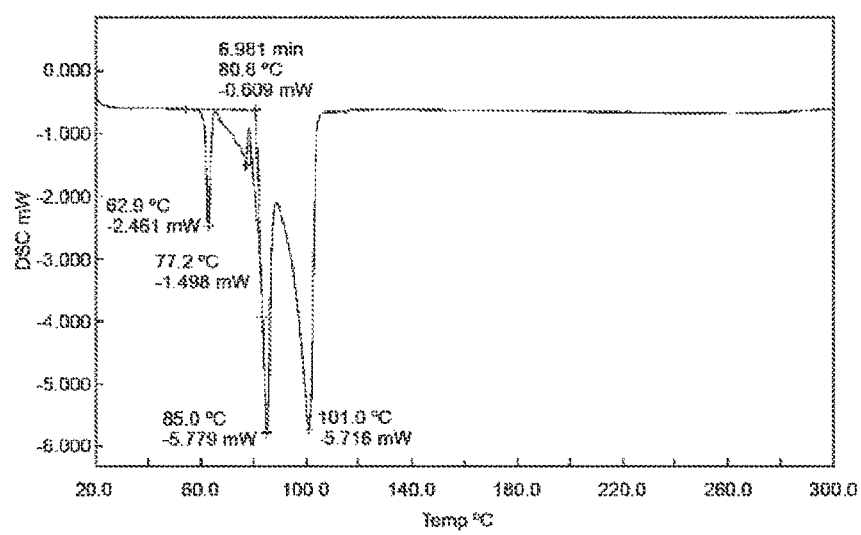
FIG. 23 shows a DSC chart of Comparative Example 6.
Figure 24:
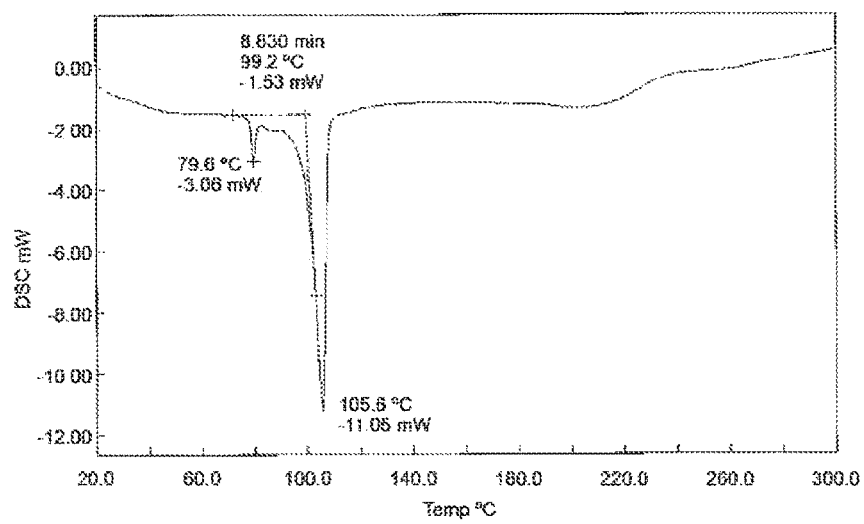
FIG. 24 shows a DSC chart of Comparative Example 8.
Figure 25:
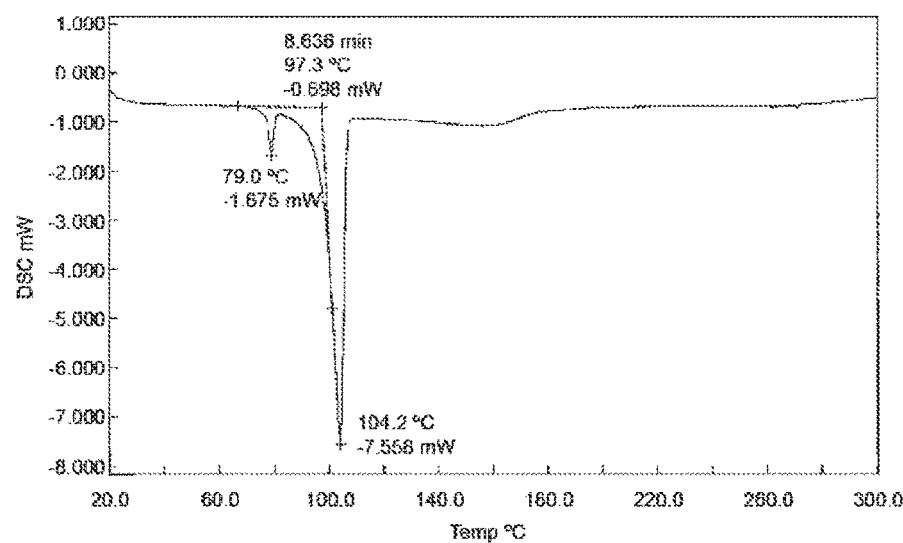
FIG. 25 shows a DSC chart of Comparative Example 9.
Figure 26:
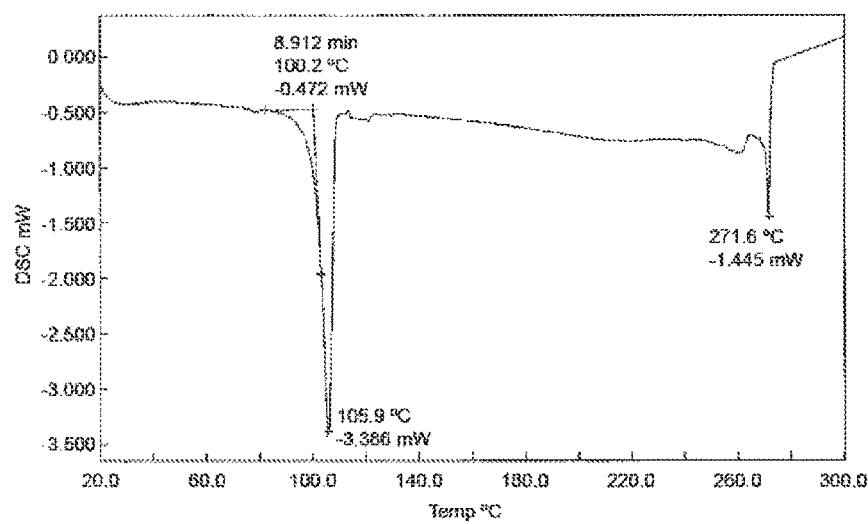
FIG. 26 shows a DSC chart of Comparative Example 10.

FIG. 2 shows a conceptual diagram of the production step of a plating layer and its solder alloy bumps on the low melting-point bonding member of the present invention, and FIG. 3 shows a conceptual diagram of the mounting thereof as reference.

FIG. 2 is an example of a conceptual diagram of the production step up to the formation of a solder alloy bump of the present invention.

1) As shown in unprocessed wafer, first, a pad 3 (Au, Al—Cu, etc.) is disposed on a substrate 1 (silicon, compound semiconductor, a piezoelectric element, a resin substrate, etc.), and a protective film 2 (SiN, polyimide, etc.) is provided.
2) As shown in feeding film formation, next, a feeding film 4 (Ti/Cu, etc.) is formed on the protective film 2 and the pad 3.
3) As shown in resist film application, next, a resist film 5 is applied on the feeding film 4.
4) As shown in exposure/development, next, the resist film 5 is subjected to exposure/development with a predetermined pattern, and a part of the resist film 5 is removed. At this time, usually, the exposure is performed at a position corresponding to the pad 3.
5) As shown in undermetal formation, next, an undermetal 6 (Ni, Cu, etc.) is formed in a portion where a hole is formed by performing exposure/development of the resist film 5.

Next, 6) to 9) are performed by the production method of the present invention.

6) As shown in plating lamination, a laminated plating layer 7 (Bi/Sn/In) is formed.
7) As shown in resist stripping, next, residual resist film 5 is removed as well. As a result, a state is created where the laminated plating layer 7 is formed on the pad 3.
8) As shown in feeding film etching, next, the feeding film 4 is removed by etching.

Then, 9) as shown in bump formation, as a result of heating and reflowing, a solder alloy bump 8 (Bi—In—Sn) is formed from the laminated plating layer 7, and can be used as the bonding member of the present invention.

Note that the plating layer 7 after the feeding film etching in 8) can also be used as it is as the bonding member of the present invention.

In addition, a Bi—In-based plating layer 7 that does not contain Sn may be formed in 6) and a Bi—In-based solder alloy bump that does not contain Sn may be formed in 9).

An example of mounting of a bonding member obtained in this manner will be described based on the conceptual diagram of mounting shown in FIG. 3. First, a semiconductor chip on which the solder alloy bump 9 is formed is positioned and disposed (refer to upper part of FIG. 3) so as to come into contact with a metal film 10 (Au) for bonding of an opposing wiring substrate or the like. Next, by performing heating and reflowing within a range of 105 to 140° C., the semiconductor chip and the wiring substrate or the like can be bonded to each other (refer to lower part of FIG. 3).

EXAMPLES

Hereinafter, the present invention will be described in more detail by way of Examples, but the present invention is not limited to the following Examples unless the gist thereof is changed.

(Composition Measurement of Plating Layer and Solder Alloy Bump)

Plating layers obtained in Examples 1 to 31 and Comparative Examples 1 to 10 were peeled off from a SUS substrate, dissolved in acid, and then quantitatively analyzed by ICP-OES (high frequency inductively coupled plasma-emission spectroscopic analyzer). Further, in Examples 32 to 35 and Reference Examples 1 to 4, solder alloy bumps obtained by heating and reflowing the plating layers were measured in the same manner as described above. The equipment used and measurement conditions were as follows.

Measurement equipment: ICP emission spectroscopic analyzer by Thermo Fisher Scientific Inc., Type: ICAP6300Duo Measurement conditions: Quantitative analysis by calibration curve method, Measurement wavelength: Sn 188.9 nm, Bi 306.7 nm, In 325.6 nm (Melting Point Measurement of Plating Layer)

An endothermic profile in an elevated temperature process was measured using a DSC (Differential Scanning Calorimeter) using samples obtained by peeling the plating layers obtained in Examples 1 to 31 and Comparative Examples 1 to 10 from the SUS substrate and crushing the plating layers as a measurement sample. In the DSC measurement in the elevated temperature process, the heat of fusion of each component appears as an endothermic peak, and results in a single or a plurality of endothermic peaks depending on the composition of the measurement sample. In the present invention, for convenience, the top temperature of each endothermic peak was treated as the melting point of the component, and when there was a plurality of peaks, the endothermic peak of the lowest temperature was regarded as the lowest melting point (solidus temperature) and the endothermic peak of the highest temperature was regarded as the highest melting point (liquidus temperature). The equipment used and measurement conditions were as follows.

Measurement equipment: DSC equipment by Seiko Instruments Inc., Type: DSC6220 type Measurement conditions: Sample amount: 10 to 15 mg Measuring pan: Aluminum Atmosphere: Nitrogen gas Measurement temperature range: room temperature to 300° C., Rate of temperature increase: 10° C./min (Measurement of Bump Diameter)

Bump diameters of the solder alloy bumps obtained in Examples 32 to 35 and Reference Examples 1 to 4 were measured by image measurement. The equipment used and measurement conditions were as follows.

Measurement equipment: Laser microscope by KEYENCE CORPORATION, Type: VK-X150

Measurement conditions: Image measurement: Length measurement from 200× image (Shear Strength Measurement of Bump)

The shear strength of the solder alloy bumps obtained in Examples 32 to 35 and Reference Examples 1 to 4 was measured with a shear strength tester. The equipment used and measurement conditions were as follows.

Measurement equipment: Bond tester by Nordson DAGE Inc., Type: 4000

Measurement conditions: Shear speed: 150 μm/s, Shear position: solder part

Example 1

Teflon (registered trademark) tape is attached to an entire back surface of a degreased and cleaned SUS304 plate (100 mm×40 mm×thickness 0.3 mm), and Teflon (registered trademark) tape is attached to the other surface to form a SUS plate with an opening of 40 mm×40 mm as the object to be plated. A 1 L beaker made of glass was used as the plating bath, about 500 mL of each plating solution was put therein, and platinum was used for the anode.

The following plating solutions were used for each of Bi and In.

Bi—Sn composite plating solution (Bi concentration 40 g/L, Sn concentration 0.8 g/L, prepared by adding Sn to Bi plating solution manufactured by Ishihara Chemical Co., Ltd.)

In plating solution: manufactured by EEJA (Electroplating Engineers of Japan) Ltd. (In concentration 25 g/L)

Bi/Sn plating was performed for the first layer. The conditions were as follows: the above described object to be plated was immersed in a Bi—Sn composite plating solution, subjected to a plating process while being shaken at a temperature of 20° C. and a constant current density of 2 A/dm² for a time necessary for obtaining a predetermined plating thickness, thereafter being pulled up and immediately immersed in a water tank. This was pulled up and washed with a water shower. and was dried at 50° C. for 5 minutes using a ventilation dryer to obtain a Bi—Sn plated article.

Successively, In plating was performed for the second layer. The object to be plated, which had been Bi-plated, was immersed in an In plating solution to be subjected to a plating process while being shaken at a temperature of 20° C. and a constant current density of 3 A/dm² for a time necessary for obtaining a predetermined plating thickness, thereafter being pulled up and immediately immersed in a water tank. This was pulled up and washed with a water shower, and was dried at 50° C. for 5 minutes using a ventilation dryer to obtain a Bi—In—Sn-based plating layer (BiSn—In plating layer).

The composition of a sample obtained by stripping the obtained Bi—In—Sn-based plating layer from the SUS plate and pulverizing it was measured using an ICP emission spectroscopic analyzer by Thermo Fisher Scientific Inc., and the melting point was measured by using the DSC equipment by Seiko Instruments Inc.

Examples 2 to 18, Comparative Examples 2 to 10

By the same method as in Example 1, plating layer samples prepared to have various Bi—In—Sn compositions were made by changing the Sn concentration in the Bi—Sn composite plating solutions and respective plating processing times.

Example 19

Teflon (registered trademark) tape is attached to the entire back surface of the degreased and cleaned SUS304 plate (100 mm×40 mm×thickness 0.3 mm), and Teflon (registered trademark) tape is attached to the other surface to form a SUS plate with an opening of 40 mm×40 mm as the object to be plated. A 1 L beaker made of glass was used as the plating bath, about 500 mL of each plating solution was put therein, and platinum was used for the anode.

The following plating solutions were used for each of Bi and In.

Bi plating solution: manufactured by Ishihara Chemical Co., Ltd. (Bi concentration 40 g/L)

In plating solution: manufactured by EEJA (Electroplating Engineers of Japan) Ltd. (In concentration 25 g/L)

Bi-plating was performed for the first layer. The conditions were as follows: the above described object to be plated was immersed in a Bi plating solution, subjected to a plating process while being shaken at a temperature of 20° C. and a constant current density of 2 A/dM² for a time necessary for obtaining a predetermined plating thickness, thereafter being pulled up and immediately immersed in a water tank. This was pulled up and washed with a water shower, and was dried at 50° C. for 5 minutes using a ventilation dryer to obtain a Bi plated article.

Successively, In plating was performed for the second layer. The object to be plated, which had been Bi-plated, was immersed in an In plating solution to be subjected to a plating process while being shaken at a temperature of 20° C. and a constant current density of 3 A/dm² for a time necessary for obtaining a predetermined plating thickness, thereafter being pulled up and immediately immersed in a water tank. This was pulled up and washed with a water shower, and was dried at 50° C. for 5 minutes using a ventilation dryer to obtain a Bi—In-based plating layer.

The composition of a sample obtained by stripping the obtained Bi—In-based plating layer from the SUS plate and pulverizing it was measured using an ICP emission spectroscopic analyzer by Thermo Fisher Scientific Inc., and the melting point was measured by using the DSC equipment by Seiko Instruments Inc.

Examples 20 to 24, Comparative Example 1

By the same method as in Example 19, plating layer samples prepared to have various Bi—In compositions were made by changing the plating processing time of each plating component.

Table 1 (composition analysis and melting point measurement results of plating layer) shows the composition analysis results and melting point measurement results of the plating layers obtained in Examples 1 to 24 and Comparative Examples 1 to 10. Further, as typical examples of the DSC chart at the time of melting point measurement, Examples 1, 2, 4, 5, 6, 8, 10, 12, 13, 14, 17, 18, 19, 21, and 23 and Comparative Examples 1, 2, 3, 5, 6, 8, 9, and 10 are shown in FIGS. 4 to 26.

From the results of the DSC measurement of Examples 1 to 24, it can be seen that the melting point of the plating layer can be set to a low melting-point region of 86 to 111° C. by controlling the composition of the plating layer within a specific range of Bi: 46 to 72 mass %, In: 26 to 54 mass %, and Sn: 0 to 2 mass %.

On the other hand, in Comparative Examples 1 to 9, an endothermic peak of less than 86° C. occurred and the presence of a low melting-point component was confirmed. In addition, in Comparative Example 10, an endothermic peak of 272° C. had occurred and the melting point had risen due to residual Bi.

From these results, it is judged that a low melting-point plating layer that is controlled to within a specific composition range can greatly contribute to realization of low temperature mounting of an integrated circuit.

Furthermore, in the production method of the present invention, a complicated alloy production step can be omitted, and a Bi—In—Sn composition or a Bi—In composition can be arbitrarily controlled by simply changing the plating time (plating liquid immersion time), so that the conventional solder alloy production step can be performed in a remarkably simple and easy manner.

TABLE 1

| Example Comparative Example | Plating lamination order | | Plated laminate composition mass % | | | DSC endothermic peak top ° C. | | | Melting point determination |
| --- | --- | --- | --- | --- | --- | --- | --- | --- | --- |
| | | | Sn | Bi | In | T1 | T2 | T3 | T4 86 to 111° C. |
| Example | 1 | Bi—Sn→In | 1.8 | 46.7 | 51.5 | 86 | | | Yes |
| | 2 | Bi—Sn→In | 1.8 | 50.9 | 47.3 | 88 | | | Yes |
| | 3 | Bi—Sn→In | 1.9 | 55.2 | 42.9 | 88 | 96 | | Yes |
| | 4 | Bi—Sn→In | 1.9 | 58.4 | 39.7 | 87 | 104 | | Yes |
| | 5 | Bi—Sn→In | 1.7 | 68.8 | 29.5 | 106 | | | Yes |
| | 6 | Bi—Sn→In | 0.9 | 46.0 | 53.1 | 88 | | | Yes |
| | 7 | Bi—Sn→In | 0.9 | 52.1 | 47.0 | 86 | 95 | | Yes |
| | 8 | Bi—Sn→In | 0.9 | 54.2 | 44.9 | 86 | 91 | 95 | Yes |
| | 9 | Bi—Sn→In | 1.1 | 56.5 | 42.4 | 90 | 99 | | Yes |
| | 10 | Bi—Sn→In | 1.1 | 60.2 | 38.7 | 89 | 107 | | Yes |
| | 11 | Bi—Sn→In | 1.2 | 63.3 | 35.5 | 108 | | | Yes |
| | 12 | Bi—Sn→In | 1.3 | 65.5 | 33.2 | 108 | | | Yes |
| | 13 | Bi—Sn→In | 1.1 | 71.5 | 27.4 | 108 | | | Yes |
| | 14 | Bi—Sn→In | 0.3 | 49.9 | 49.8 | 88 | 91 | | Yes |
| | 15 | Bi—Sn→In | 0.4 | 53.6 | 46.0 | 88 | 91 | | Yes |
| | 16 | Bi—Sn→In | 0.3 | 59.0 | 40.7 | 89 | 107 | | Yes |
| | 17 | Bi—Sn→In | 0.3 | 65.1 | 34.6 | 110 | | | Yes |
| | 18 | Bi—Sn→In | 0.3 | 70.1 | 29.6 | 109 | | | Yes |
| | 19 | Bi→In | 0.0 | 46.8 | 53.2 | 91 | | | Yes |
| | 20 | Bi→In | 0.0 | 52.6 | 47.4 | 89 | 93 | | Yes |
| | 21 | Bi→In | 0.0 | 55.4 | 44.6 | 89 | 92 | 108 | Yes |
| | 22 | Bi→In | 0.0 | 60.0 | 40.0 | 89 | 92 | 111 | Yes |
| | 23 | Bi→In | 0.0 | 65.0 | 35.0 | 111 | | | Yes |
| | 24 | Bi→In | 0.0 | 68.4 | 31.6 | 111 | | | Yes |
| Comparative Example | 1 | Bi→In | 0.0 | 43.8 | 56.2 | 72 | 89 | 110 | No |
| | 2 | Bi—Sn→In | 1.7 | 45.2 | 53.1 | 70 | 86 | | No |
| | 3 | Bi—Sn→In | 2.7 | 46.9 | 50.4 | 63 | 81 | 88 | No |
| | 4 | Bi—Sn→In | 2.7 | 49.0 | 48.3 | 63 | 81 | 87 | 95 No |
| | 5 | Bi—Sn→In | 2.8 | 52.9 | 44.3 | 63 | 84 | 100 | No |
| | 6 | Bi—Sn→In | 2.6 | 55.6 | 41.8 | 63 | 85 | 101 | No |
| | 7 | Bi—Sn→In | 2.1 | 59.1 | 38.8 | 79 | 105 | | No |
| | 8 | Bi—Sn→In | 2.5 | 64.3 | 33.2 | 80 | 106 | | No |

TABLE 1-continued

| Example Comparative Example | Plating lamination order | Plated laminate composition mass % | | | DSC endothermic peak top ° C. | | | | Melting point determination 86 to 111° C. |
|---|---|---|---|---|---|---|---|---|---|
| | | Sn | Bi | In | T1 | T2 | T3 | T4 | |
| 9 | Bi—Sn→In | 2.3 | 69.0 | 28.7 | 79 | 104 | | | No |
| 10 | Bi—Sn→In | 1.1 | 74.4 | 24.5 | 106 | 272 | | | No |

Addition of Mixed Components (Examples 25 to 31)

Examples 25 to 26

Sn and Ag were respectively added to a Bi plating solution (Bi concentration 40 g/L) to prepare a Bi—Sn composite plating solution containing Bi=40 g/L and Sn=0.8 g/L and a Bi—Ag composite plating solution containing Bi=40 g/L and Ag=0.8 g/L. The same operation as in Example 1 was performed except that Bi/Ag plating was performed between Bi/Sn plating and In plating and that plated lamination was performed in the order of Bi/Sn→Bi/Ag→In to obtain a plating layer in which a minute amount of Ag has been added to Bi—In—Sn.

Note that the Bi/Ag plating was performed in a similar manner to the Bi/Sn plating except that the Bi—Ag composite plating solution was used instead of the Bi—Sn composite plating solution.

The composition of a sample obtained by stripping the obtained plating layer from the SUS plate and pulverizing it was measured using an ICP emission spectroscopic analyzer by Thermo Fisher Scientific Inc., and the melting point was measured by using the DSC equipment by Seiko Instruments Inc.

Examples 27 to 28

Sn and Cu were respectively added to a Bi plating solution (Bi concentration 40 g/L) to prepare a Bi—Sn composite plating solution containing Bi=40 g/L and Sn=0.8 g/L and a Bi—Cu composite plating solution containing Bi=40 g/L and Cu=1 g/L. The same operation as in Example 1 was performed except that Bi/Cu plating was performed between Bi/Sn plating and In plating and that plated lamination was performed in the order of Bi/Sn→Bi/Cu→In to obtain a plating layer in which a minute amount of Cu has been added to Bi—In—Sn.

Note that the Bi/Cu plating was performed in a similar manner to the Bi/Sn plating except that the Bi—Cu composite plating solution was used instead of the Bi—Sn composite plating solution.

The composition of a sample obtained by stripping the obtained plating layer from the SUS plate and pulverizing it was measured using an ICP emission spectroscopic analyzer by Thermo Fisher Scientific Inc., and the melting point was measured by using the DSC equipment by Seiko Instruments Inc.

Examples 29 to 30

Ag was added to a Bi plating solution to prepare a Bi—Ag composite plating solution containing Bi=40 g/L and Ag=0.4 g/L. The same operation as in Example 19 was performed except that plated lamination was performed in the order of Bi/Ag→In to obtain a plating layer in which a minute amount of Ag has been added to Bi—In. The composition of a sample obtained by stripping the plating layer from the SUS plate and pulverizing it was measured using an ICP emission spectroscopic analyzer by Thermo Fisher Scientific Inc., and the melting point was measured using a DSC apparatus of Seiko Instruments Inc.

Example 31

Cu was added to a Bi plating solution to prepare a Bi—Cu composite plating solution containing Bi=40 g/L and Cu=0.5 g/L. The same operation as in Example 19 was performed except that plated lamination was performed in the order of Bi/Cu→In to obtain a minute-Cu-added plating layer in which a minute amount of Cu has been added to Bi—In. The composition of a sample obtained by stripping the plating layer from the SUS plate and pulverizing it was measured using an ICP emission spectroscopic analyzer by Thermo Fisher Scientific Inc., and the melting point was measured using a DSC apparatus of Seiko Instruments Inc.

The results of Examples 25 to 31 are shown in Table 2 (composition analysis and melting point measurement results of plating layer added with a minute amount of Cu, Ag).

From the results of the DSC measurement of Examples 25 to 31, due to the fact that the melting point of a low melting-point plating layer (a Bi—In-based plating layer or a Bi—In—Sn-based plating layer) to which a minute amount of Ag or Cu has been added is a low melting-point region within a range of 86 to 111° C., it was confirmed that the low melting-point plating layer to which a minute amount of Ag or Cu has been added can be used as a conductive bonding material for low temperature mounting.

TABLE 2

| Example | Plating lamination order | Plated laminate composition mass % | | | | | DSC endothermic peak top ° C. | | | Melting point determination 86 to 111° C. |
|---|---|---|---|---|---|---|---|---|---|---|
| | | Sn | Bi | In | Ag | Cu | T1 | T2 | T3 | |
| 25 | Bi—Sn→Bi—Ag→In | 0.7 | 50.6 | 47.8 | 0.9 | — | 90 | 108 | | Yes |
| 26 | Bi—Sn→Bi—Ag→In | 0.6 | 66.6 | 32.0 | 0.8 | — | 108 | | | Yes |
| 27 | Bi—Sn→Bi—Cu→In | 0.7 | 50.4 | 48.1 | — | 0.8 | 91 | 109 | | Yes |
| 28 | Bi—Sn→Bi—Cu→In | 0.8 | 65.3 | 33.0 | — | 0.8 | 110 | | | Yes |
| 29 | Bi—Sn→Bi—Ag→In | 0.0 | 50.5 | 48.8 | 0.8 | — | 89 | 92 | 98 | Yes |

TABLE 2-continued

| Example | Plating lamination order | Plated laminate composition mass % | | | | | DSC endothermic peak top ° C. | | | Melting point determination 86 to 111° C. |
|---|---|---|---|---|---|---|---|---|---|---|
| | | Sn | Bi | In | Ag | Cu | T1 | T2 | T3 | |
| 30 | Bi—Sn→Bi—Ag→In | 0.0 | 65.1 | 34.0 | 0.9 | — | 111 | | | Yes |
| 31 | Bi—Cu→In | 0.0 | 50.8 | 48.5 | — | 0.7 | 89 | 92 | 110 | Yes |

Measurement of Bump Shear Strength (Examples 32 to 35 and Reference Examples 1 to 4)

Examples 32 to 33

A Ti film with a thickness of 0.1 μm and a Cu film with a thickness of 0.3 μm were formed by sputtering on the surface of a silicon wafer with an oxide film, to make a silicon wafer on which a resist pattern provided with openings (30 μm×height 20 μm: 1000000 pieces, a pitch interval (50 μm)) for wire connection is formed by photolithography. Subsequently, a film of Ni was formed in a thickness of 3 μm by electrolytic plating to make a patterned object to be plated with an undermetal.

Using the patterned object to be plated described above, plated articles were made in an order of "Bi→Sn→In". A 30 L plating tank made of a vinyl chloride resin was used as the plating bath, about 25 L of each plating solution was put therein, and tin was used for the anode of the Sn plating and platinum was used for the anode of the Bi plating and the In plating. The following plating solutions were used for each of the Sn plating, the Bi plating, and the In plating.

Sn plating solution: manufactured by Ishihara Chemical Co., Ltd. (Sn concentration 20 g/L)
Bi plating solution: manufactured by Ishihara Chemical Co., Ltd. (Bi concentration 20 g/L)
In plating solution: manufactured by Ishihara Chemical Co., Ltd. (In concentration 20 g/L)

Bi-plating was performed for the first layer. The conditions were as follows: the above described object to be plated was immersed in a Bi plating solution, subjected to a plating process while being shaken at a temperature of 20° C. and a constant current density of 2 A/dm$^2$ for a time necessary for obtaining a predetermined plating thickness. After the plating process, the object to be plated was pulled up and subjected to washing with water by a shower.

Subsequently, Sn plating was performed for the second layer. The object to be plated, which had been Bi-plated, was immersed in a Sn plating solution to be subjected to a plating process while being shaken at a temperature of 20° C. and a constant current density of 1.5 A/dm$^2$ for a time necessary for obtaining a predetermined plating thickness. After the plating process, the object to be plated was pulled up and subjected to washing with water by a shower.

Subsequently, In plating was performed for the third layer. The object to be plated, which had been Bi—Sn-plated, was immersed in an In plating solution to be subjected to a plating process while being shaken at a temperature of 20° C. and a constant current density of 1.5 A/dm$^2$ for a time necessary for obtaining a predetermined plating thickness. After the plating process, the object to be plated was pulled up and subjected to washing with water by a shower.

After drying the object to be plated in a constant-temperature dryer for 5 minutes at 50° C., the object to be plated was immersed in a resist stripper to remove the resist. Subsequently, the object to be plated was immersed in a Cu etching solution in order to etch Cu in portions where a plated article is not formed. Subsequently, the object to be plated was immersed in a Ti etching solution in order to etch Ti in portions where a plated article is not formed and a Bi—In—Sn-based plated article was made.

Subsequently, the produced Bi—In—Sn-based plated article was reflowed under the following conditions using a VSU-200 reflow apparatus manufactured by Shinapex Co., Ltd. to make a Bi—In—Sn-based low melting-point solder alloy bump.

Reducing agent: formic acid
Pressure: 200 mbar
Rate of temperature increase: 20° C./min
Top temperature: 140° C. (keeping time 180 sec)

Figure 27:
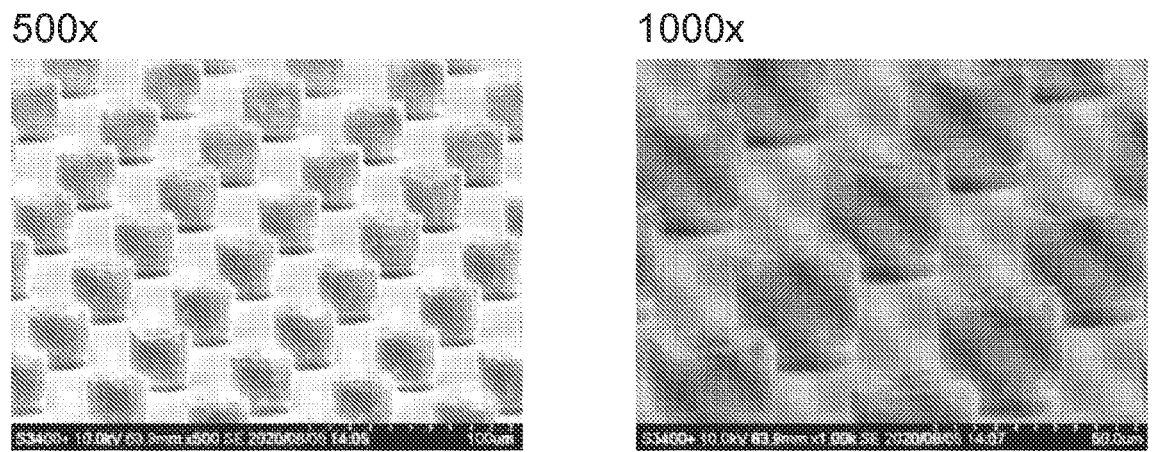
FIG. 27 is an appearance SEM image of a plated article of Example 32.
Figure 28:
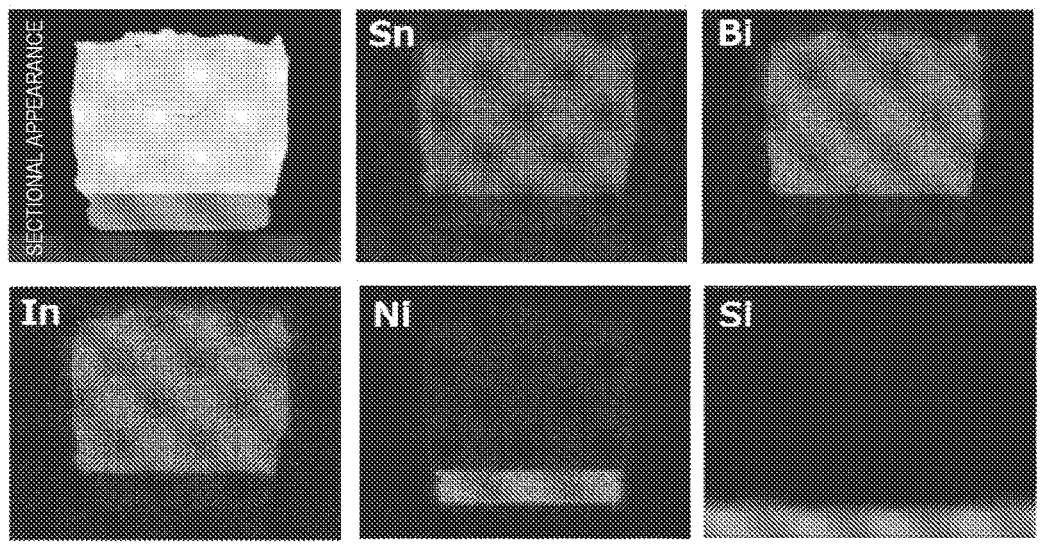
FIG. 28 shows a SEM-EDX sectional image of a plated article of Example 32.

FIG. 27 shows an appearance image of the Bi—In—Sn-based plated article of Example 32. Further, the result of SEM-EDX observation of the cross section thereof is shown in FIG. 28.

Figure 29:
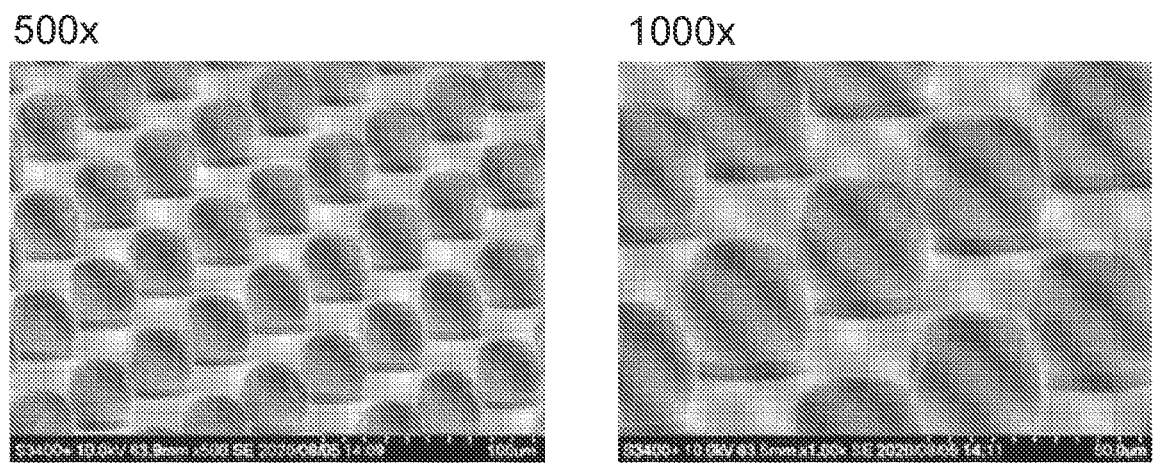
FIG. 29 is an appearance SEM image of a bump of Example 32.
Figure 30:
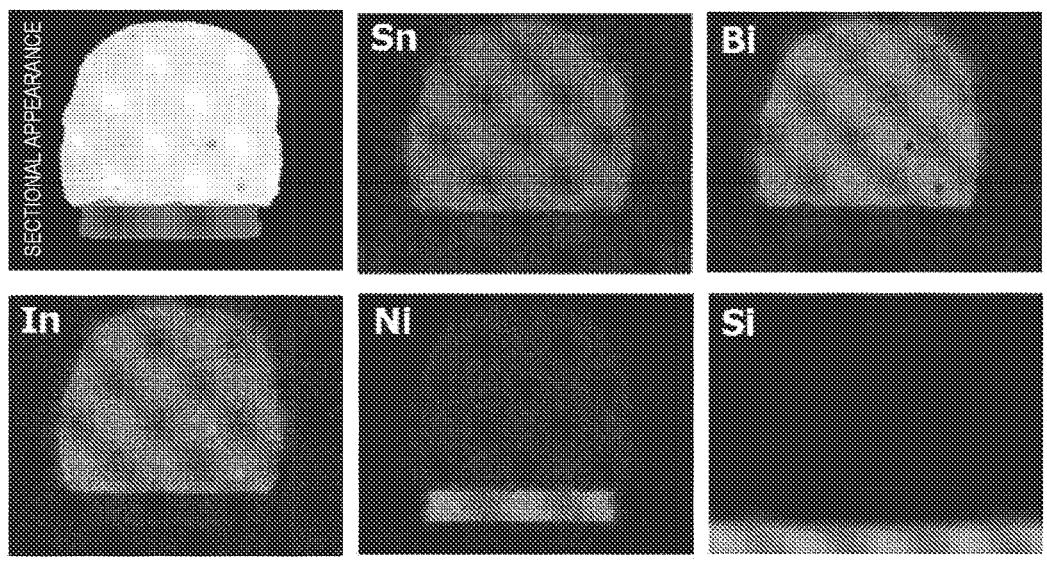
FIG. 30 is a SEM-EDX sectional image of a bump of Example 32.

In addition, FIG. 29 shows an appearance image of a bump made from the Bi—In—Sn-based plated article of Example 32, and FIG. 30 shows the result of SEM-EDX observation of the cross section thereof.

Figure 31:
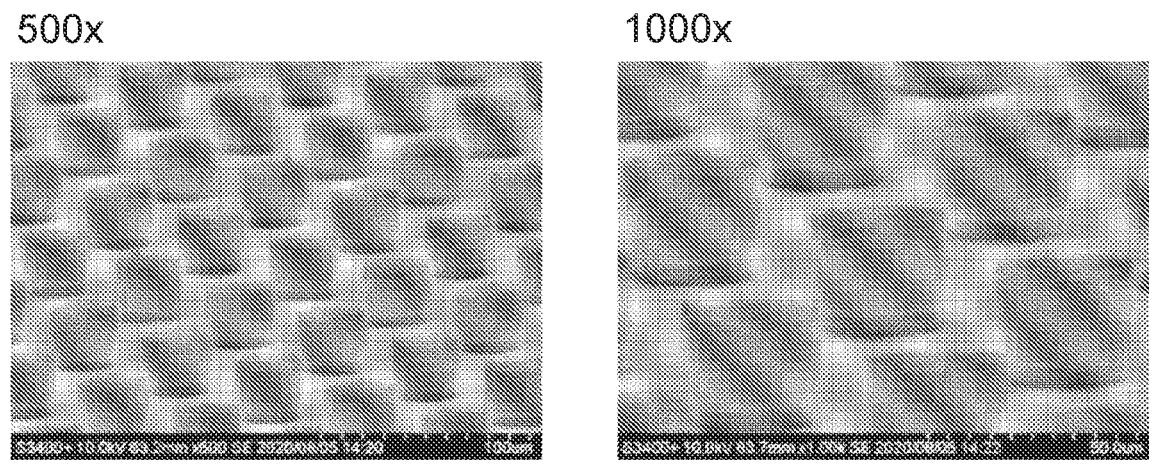
FIG. 31 is an appearance SEM image of a plated article of Example 33.
Figure 32:
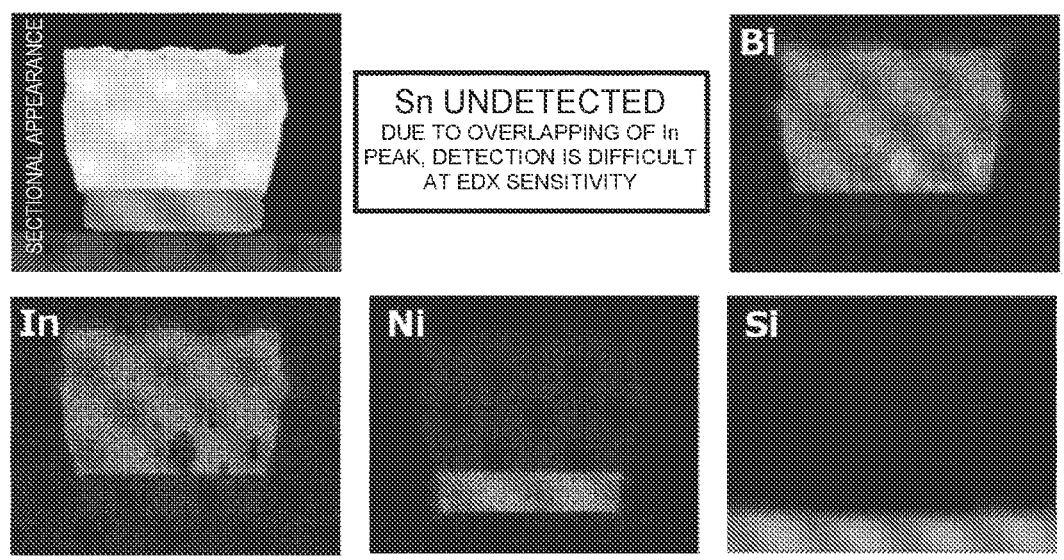
FIG. 32 shows a SEM-EDX sectional image of a plated article of Example 33.

FIG. 31 shows an appearance image of the Bi—In—Sn-based plated article of Example 33. Further, the result of SEM-EDX observation of the cross section thereof is shown in FIG. 32.

Figure 33:
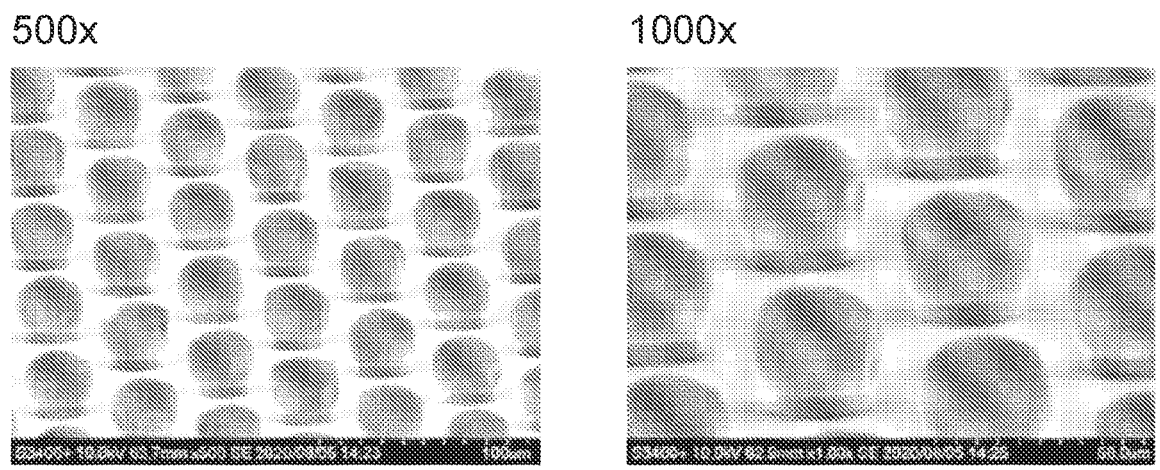
FIG. 33 is an appearance SEM image of a bump of Example 33.
Figure 34:
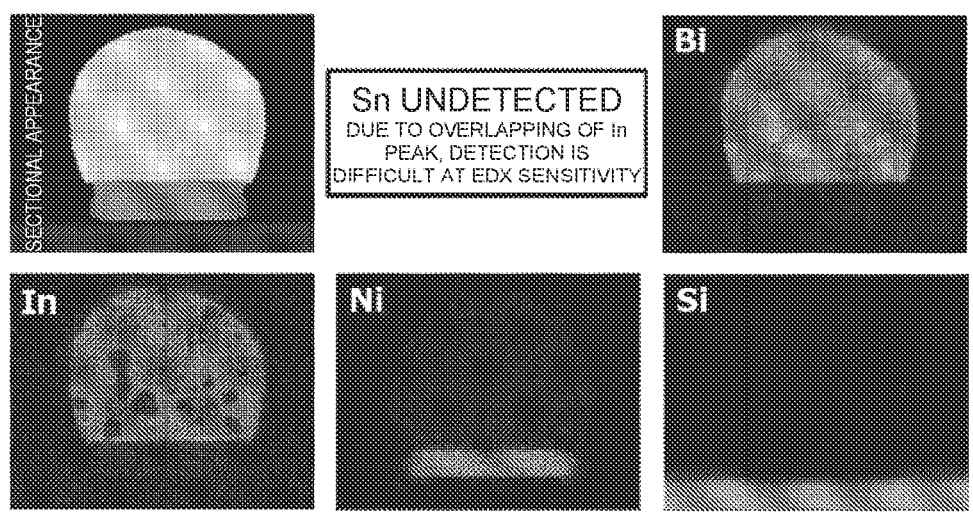
FIG. 34 is a SEM-EDX sectional image of a bump of Example 33.

In addition, FIG. 33 shows an appearance image of a bump made from the Bi—In—Sn-based plated article of Example 33, and FIG. 34 shows the result of SEM-EDX observation of the cross section thereof.

Examples 34 to 35

In Examples 34 to 35, using a patterned object to be plated made by the same operation as in Examples 32 to 33, the same operation as in Examples 32 to 33 was performed except that the plating time (immersion time) in each plating solution was changed such that the plated article has a predetermined composition and the plating process was performed in the order of "Bi→In" without performing Sn plating to make a Bi—In-based plated article and a low melting-point solder alloy bump.

Figure 35:
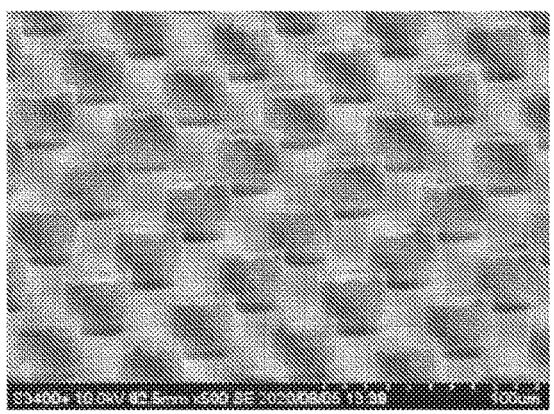
FIG. 35 is an appearance SEM image of a plated article of Example 34.
Figure 35:
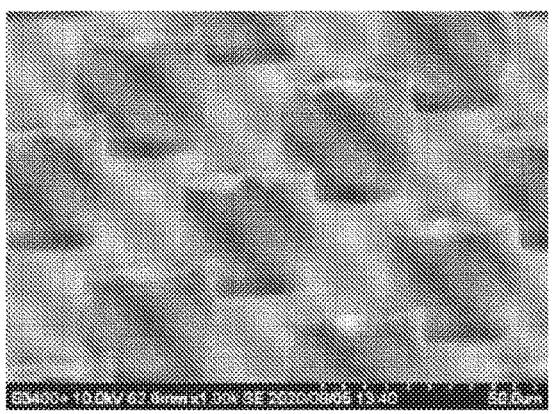
Figure 36:
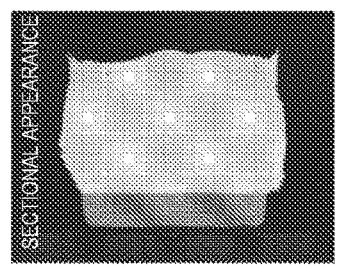
FIG. 36 shows a SEM-EDX sectional image of a plated article of Example 34.
Figure 36:
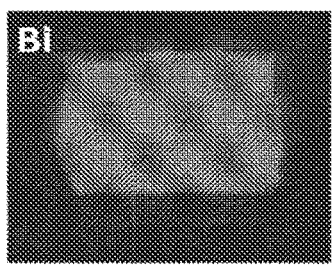
Figure 36:
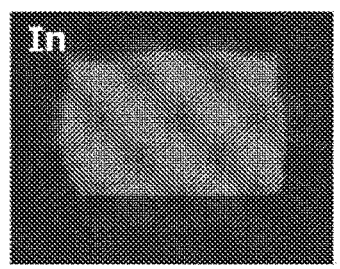
Figure 36:
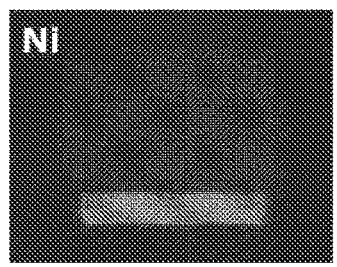
Figure 36:
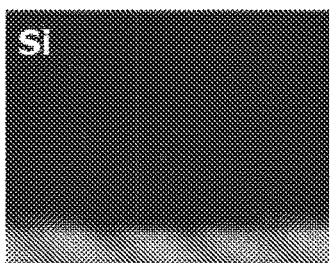

FIG. 35 shows an appearance image of the Bi—In-based plated article of Example 34. Further, the result of SEM-EDX observation of the cross section thereof is shown in FIG. 36.

Figure 37:
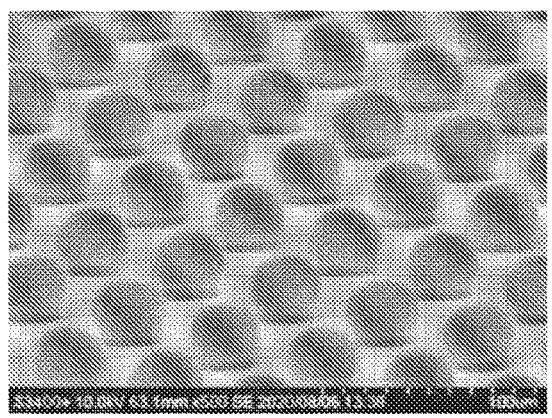
FIG. 37 is an appearance SEM image of a bump of Example 34.
Figure 37:
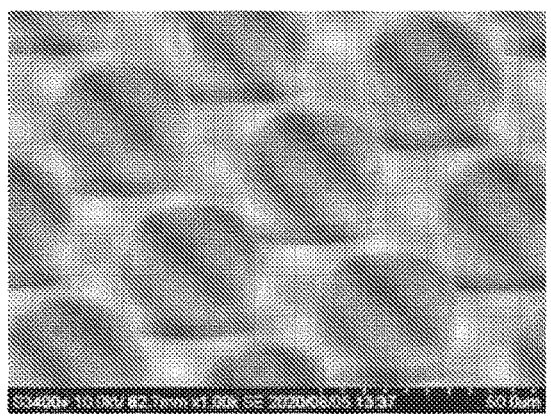
Figure 38:
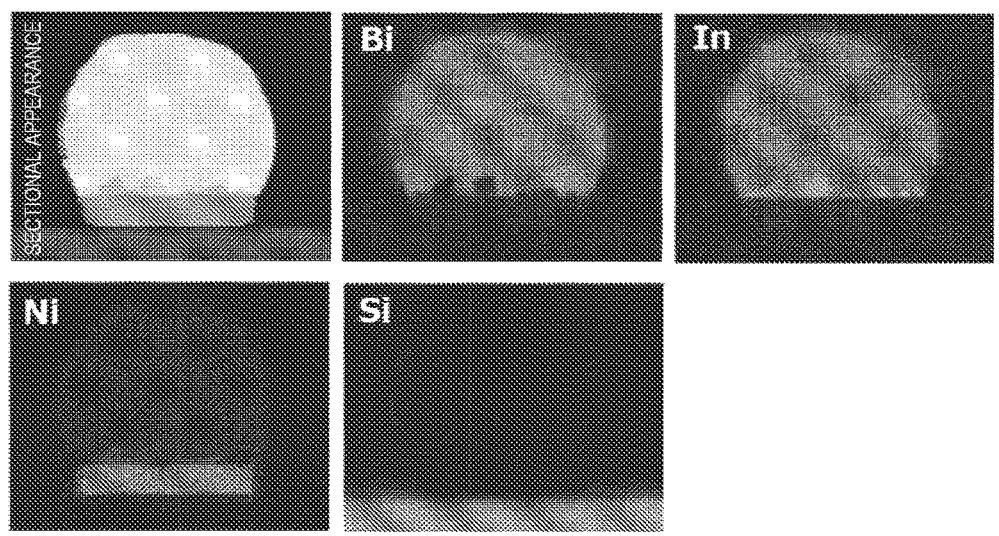
FIG. 38 is a SEM-EDX sectional image of a bump of Example 34.

In addition, FIG. 37 shows an appearance image of a bump made from the Bi—In-based plated article of Example 34, and FIG. 38 shows the result of SEM-EDX observation of the cross section thereof.

Figure 39:
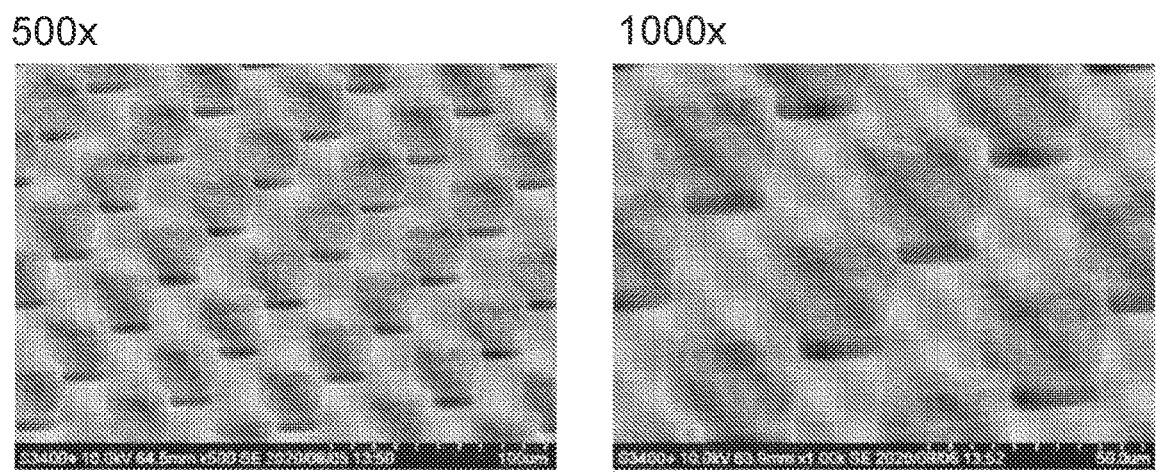
FIG. 39 is an appearance SEM image of a plated article of Example 35.
Figure 40:
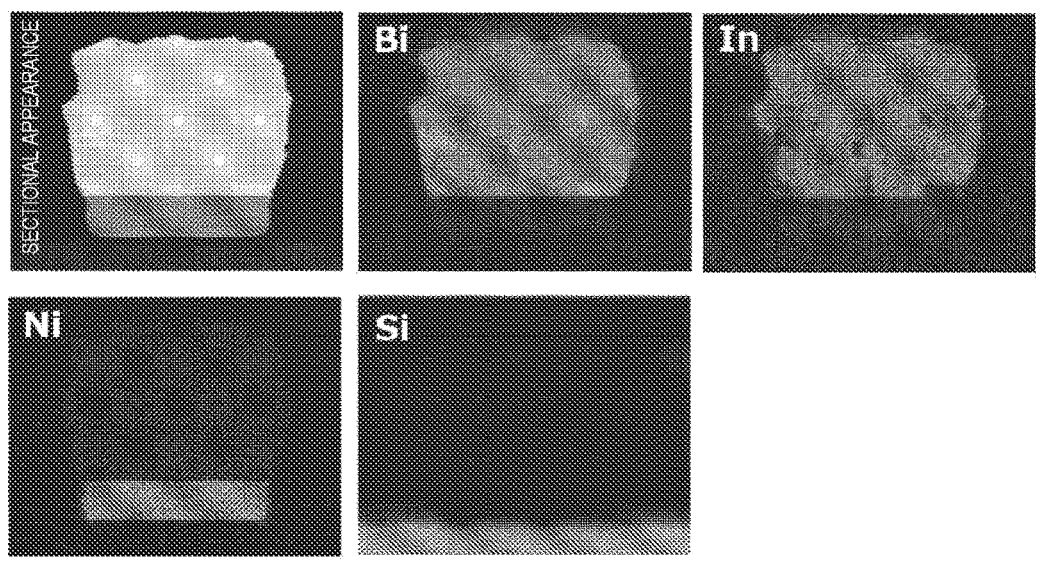
FIG. 40 shows a SEM-EDX sectional image of a plated article of Example 35.

FIG. 39 shows an appearance image of the Bi—In-based plated article of Example 35. Further, the result of SEM-EDX observation of the cross section thereof is shown in FIG. 40.

Figure 41:
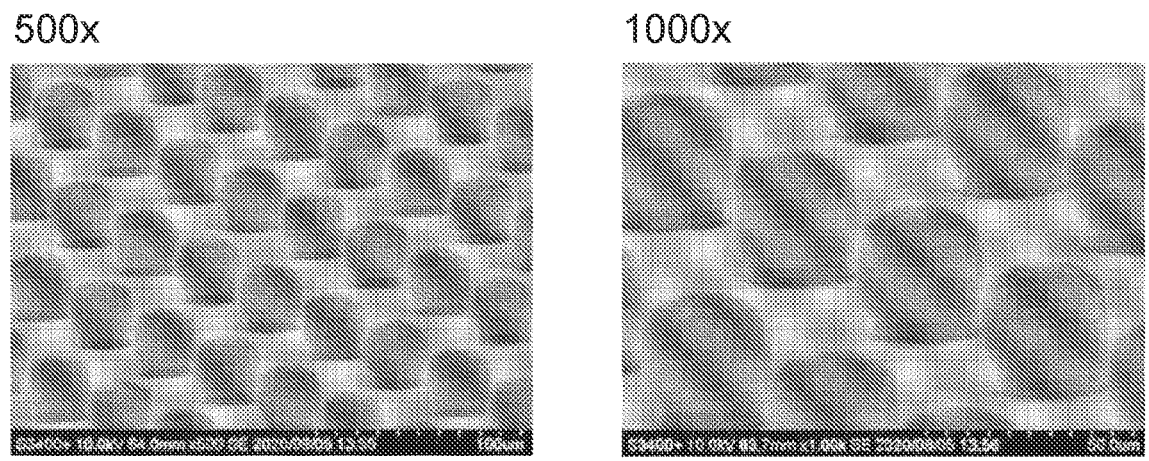
FIG. 41 is an appearance SEM image of a bump of Example 35.
Figure 42:
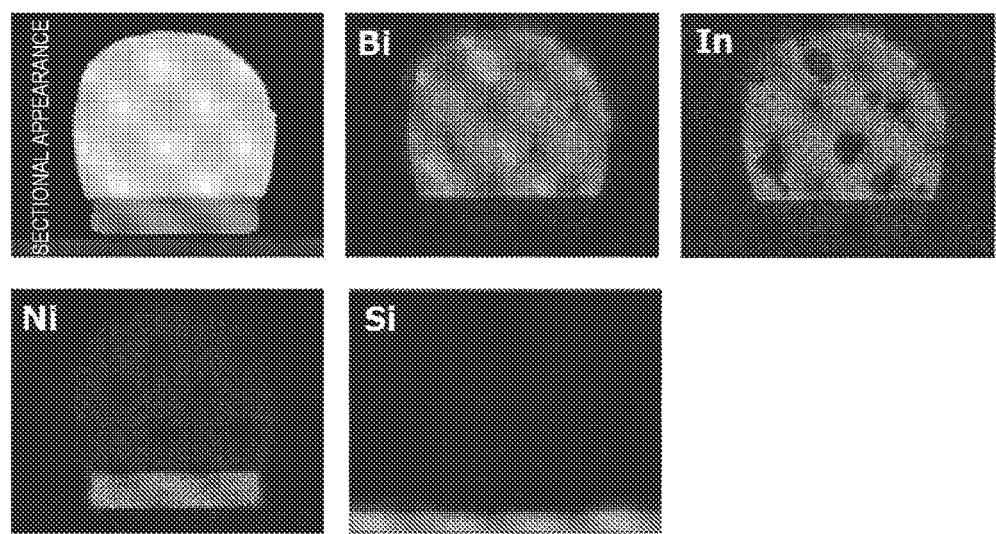
FIG. 42 is a SEM-EDX sectional image of a bump of Example 35.

In addition, FIG. 41 shows an appearance image of a bump made from the Bi—In-based plated article of Example 35, and FIG. 42 shows the result of SEM-EDX observation of the cross section thereof.

Reference Examples 1 to 4

Reference Examples 1 to 3 are known Pb-free solder alloy bumps produced for the purpose of comparing the bump shear strength with the known Pb-free solder alloy. Using a silicon wafer on which a resist pattern similar to that of Example 32 was formed (however, the openings for connection are 60 μmϕ×height 60 μm in Reference Examples 1 and 2, 50 μmϕ×height 35 μm in Reference Example 3, and 200 μmϕ×height 10 μm in Reference Example 4), a film of the undermetal shown in Table 3 was formed by the same operation. However, in Reference Example 1 and Reference Example 3, a 10 μm Cu post was formed by electrolytic plating under a 3 μm Ni plating layer, in Reference Example 2, a 5 μm Ni plating layer was formed, and in Reference Example 4, a Ni plating layer was omitted. Then, on it, SnAg plating was performed using a known SnAg plating solution in Reference Example 1 and Reference Example 2. In Reference Example 3, laminate plating of Sn and Bi was performed using a known Sn plating solution and a known Bi plating solution. In Reference Example 4, In plating was performed using a known In plating solution. After each of these were dried and subjected to the same resist removing operation as in Example 32, solder alloy bumps were made under the same operating conditions and using a similar reflow apparatus except that the reflow temperature shown in Table 3 was set.

Figure 43:
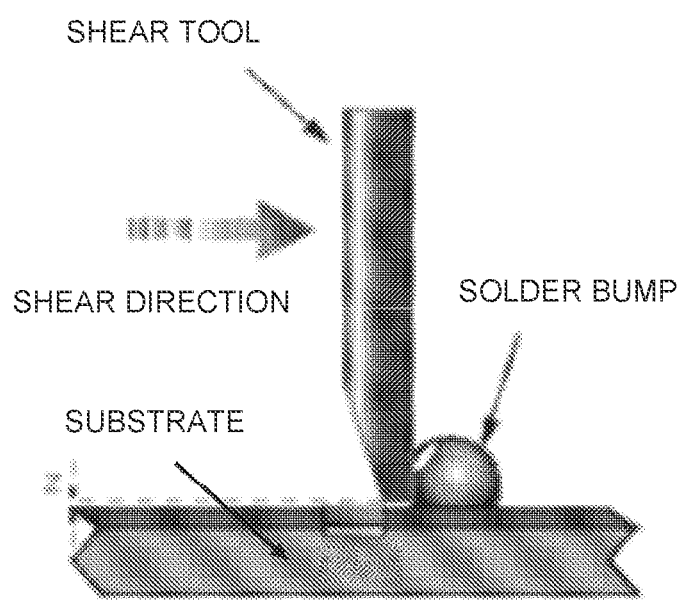
FIG. 43 is a conceptual diagram of a shear strength tester.

Table 3 shows the bump composition and shear strength measurement results of Examples 32 to 35 and Reference Examples 1 to 4. Note that a plating lamination thickness in the table is a target value for achieving a predetermined composition. For reference, a conceptual diagram of a shear strength tester is shown in FIG. 43.

Among the known Pb-free solder alloy bumps, although the indium-only system of Reference Example 4 cannot be put into practical use because of its remarkably low bump shear strength of 0.3 mg/μm$^2$, the bump shear strength of the SnAg system and the SnBi system of Reference Examples 1 to 3, which are usually used as a Pb-free solder alloy, is 3.3 mg/μm$^2$.

As a shape of the Bi—In—Sn-based low melting-point plated article, from the appearance SEM images of the plating layers of Examples 32 and 33 shown in FIGS. 27 and 31, it can be seen that a columnar plating layer corresponding to the resist pattern is formed.

Further, while the plating layers are made by laminated plating in an order of Bi→Sn→In on top of a Cu/Ni undermetal, from the SEM-EDX sectional image of the plating layer of Example 32 shown in FIG. 28, it was observed that In and Sn were diffused in the Bi layer almost uniformly.

Even in Example 33, from the SEM-EDX sectional images of the plating layer shown in FIG. 32, it was observed that In was diffused in the Bi layer. On the other hand, with respect to Sn, since the amount of Sn is a minute amount and an In peak of SEM-EDX overlaps with an Sn peak, detection is difficult at EDX sensitivity, but it is conceivable that In and Sn are diffused in the Bi layer in a similar manner to Example 32.

In this manner, in a final plating layer, the formation of a BiInSn alloy due to the diffusion of In and Sn conceivably causes a melting point which is significantly lower than the melting point of each of Bi, In, and Sn alone to be exhibited. In addition, it is considered that, due to progress of BiInSn alloying of the plating layers even in the heating and reflowing stage, the melting point will be further lowered.

With respect to the formation of the Bi—In-based low melting-point solder alloy bump made by heating and reflowing the plating layers of Examples 32 and 33 at 140° C., from the appearance SEM images of bumps of Examples 32 and 33 shown in FIGS. 29 and 33, it can be seen that hemispherical solder alloy bumps are formed on the Cu/Ni undermetal. In addition, from the SEM-EDX image of the cross section of the bump of Example 32 shown in FIG. 30, it was confirmed that a solder alloy bump in which Bi, In, and Sn were dispersed almost uniformly was formed by heating and reflowing the plating layer.

Even in Example 33, from the SEM-EDX image of the cross section of the bump shown in FIG. 34, it was observed that Bi and In were diffused in the entire solder alloy bump. On the other hand, with respect to Sn, although the amount of Sn was a minute amount and detection was difficult at EDX sensitivity, it is conceivable that Sn is also diffused in the entire solder alloy bump in a similar manner to Example 32.

As a shape of the Bi—In-based low melting-point plated laminate, from the appearance SEM images of the plating layers of Examples 34 and 35 shown in FIGS. 35 and 39, it can be seen that a columnar plating layer corresponding to the resist pattern is formed. Further, while the plating layers are made by laminated plating in an order of Bi→In on top of a Cu/Ni undermetal, from the SEM-EDX sectional image of the plating layers shown in FIGS. 36 and 40, it was observed that In was diffused in the Bi layer. In this manner, in a final plating layer, the formation of a BiIn alloy due to the diffusion of In causes a melting point which is significantly lower than the melting point of each of Bi and In alone to be exhibited. In addition, it is considered that, due to progress of BiIn alloying of the plating layers even in the heating and reflowing stage, the melting point will be further lowered.

With respect to the formation of the Bi—In-based low melting-point solder alloy bump made by heating and reflowing these plating layers at 140° C., from the appearance SEM images of bumps of Examples 34 and 35 shown in FIGS. 37 and 41, it can be seen that hemispherical solder alloy bumps are formed on the Cu/Ni undermetal. In addition, from the SEM-EDX images of the cross section of the bumps shown in FIGS. 38 and 42, it was confirmed that a large part of the solder alloy bumps was formed by a BiIn alloy containing Bi and In by heating and reflowing the plating layers.

In addition, it has been found that shear strengths of solder alloy bumps of the low melting-point plated laminates (Bi—In—Sn-based plated laminate or Bi—In-based plated laminate) obtained by the production method of the present invention of Examples 32 to 35 shown in Table 3 (bump composition and shear strength) all have sufficient bonding strength of "3 mg/μm$^2$ or more" and, therefore, the low melting-point plated laminates can be practically used as bonding materials.

TABLE 3

| Example Reference | Undermetal and thickness (Numeral is film thickness: μm) | Plated laminate thickness (μm) | | | Bumping reflow temperature (° C.) | Bump composition (mass %) | | | Bump diameter (μm) | Bump shear strength (mg/μm²) |
|---|---|---|---|---|---|---|---|---|---|---|
| Example | | Sn | Bi | In | | Sn | Bi | In | | |
| Example 32 | Ti0.1/Cu0.3/Ni3 | 0.3 | 8.5 | 11.2 | 140 | 1.2 | 50.0 | 48.8 | φ30 | 4.3 |
| Example 33 | Ti0.1/Cu0.3/Ni3 | 0.1 | 12 | 7.9 | 140 | 0.3 | 66.8 | 32.9 | φ30 | 6.0 |
| Example 34 | Ti0.1/Cu0.3/Ni3 | — | 8.6 | 11.4 | 140 | — | 50.1 | 49.9 | φ30 | 4.9 |
| Example 35 | Ti0.1/Cu0.3/Ni3 | — | 12 | 8 | 140 | — | 66.8 | 33.2 | φ30 | 3.2 |
| Reference Example 1 | Ti0.1/Cu10.3/Ni3 | SnAg: 25.0 | | | 230 | Sn2.5Ag | | | φ60 | 3.3 |
| Reference Example 2 | Ti0.1/Cu0.3/Ni5 | SnAg: 25.0 | | | 230 | Sn3.2Ag | | | φ60 | 3.3 |
| Reference Example 3 | Ti0.1/Cu10.3/Ni3 | 11.5 | 12.0 | — | 160 | 42.0 | 58.0 | — | φ50 | 3.3 |
| Reference Example 4 | Ti0.1/Cu0.3 | — | — | 10.0 | 180 | — | — | 100 | φ200 | 0.3 |

INDUSTRIAL APPLICABILITY

The present invention can be suitably used for Pb-free soldering mounting applications of semiconductor electronic components and wiring substrates. In particular, since low-temperature bonding is possible, it can be suitably used as a method for low-temperature mounting of electronic components having low heat resistance, such as flexible substrates (resin substrates), piezoelectric elements, CdTe semiconductor elements, CCD elements, and hologram elements.

REFERENCE SIGNS LIST

1 Substrate
2 Protective film
3 Pad
4 Feeding film
Resist film
6 Undermetal
7 Laminated plating layer
8 Solder alloy bump
9 Solder alloy bump
10 Metal film (Au) for bonding

The invention claimed is:

1. A low melting-point bonding member for mounting a semiconductor electronic circuit, comprising
a plating layer formed of a low melting-point alloy, wherein the low melting-point alloy is made up of Bi, In, Sn, and inevitably-contained impurities, wherein
the low melting-point alloy contains Bi: 63 mass % or more and 72 mass % or less, In: 26 mass % or more and 36.9 mass % or less, and Sn: 0.1 mass % or more and 2 mass % or less when a total amount of Bi, In, and Sn in the low melting-point alloy is 100 mass % and has a melting point of 106 to 111° C., and
the low melting-point alloy is disposed on a film formed of one or more kinds of undermetal selected from the group consisting of Ti, Ni, Cu, Au, Sn, Ag, Cr, Pd, Pt, W, Co, TiW, NiP, NiB, NiCo, and NiV.

2. A low melting-point bonding member for mounting a semiconductor electronic circuit, comprising
a micro member having a size of 1 mm or less and having a plating layer coating a surface layer of any core material selected from the group consisting of a micro metal ball, a micro resin ball having a coating layer of a conductive metal, a micro resin ball having a coating layer of a solder alloy, and a micro pin member, wherein
the plating layer is formed of a low melting-point alloy, wherein the low melting-point alloy is made up of Bi, In, Sn, and inevitably-contained impurities, and
the low melting-point alloy contains Bi: 63 mass % or more and 72 mass % or less, In: 26 mass % or more and 36.9 mass % or less, and Sn: 0.1 mass % or more and 2 mass % or less when a total amount of Bi, In, and Sn in the low melting-point alloy is 100 mass % and has a melting point of 106 to 111° C.

3. The low melting-point bonding member according to claim 2, wherein
the micro member is mounted on a conductive bonding portion.

4. A method for producing a low melting-point bonding member, comprising
a plating step of performing a plating process at least including Bi plating and In plating and forming, on an object to be plated, a plating layer made up of Bi, In, and inevitably-contained impurities or a plating layer made of Bi, In, Sn, and inevitably-contained impurities, wherein
the plating layer contains Bi: 46 mass % or more and 72 mass % or less, In: 26 mass % or more and 54 mass % or less, and Sn: 2 mass % or less when a total amount of Bi, In, and Sn is 100 mass %, and
the plating step is a plating step (A) or a plating step (B) described below:
Plating step (A): a step in which the plating process includes Bi plating and In plating and in which the In plating is performed after the Bi plating is performed,
Plating step (B): a step in which the plating process includes Bi plating, In plating, and Sn plating and in which the plating process to be first performed on the object to be plated is Sn plating or Bi plating, and the In plating is performed after the Sn plating and the Bi plating are performed.

5. A method for producing a low melting-point bonding member, comprising
forming a bump by heating and reflowing a low melting-point bonding member which is produced by the method for producing a low melting-point bonding member according to claim 4 and which is disposed on a conductive bonding portion.

6. A semiconductor electronic circuit, comprising a low melting-point bonding member according to claim 1.

7. A method for mounting a semiconductor electronic circuit, comprising
heating and reflowing, in a range from 105 to 140° C., the low melting-point bonding member according to claim 1 which is disposed between a wiring substrate and a semiconductor chip surface, thereby bonding the wiring substrate and the semiconductor chip.

8. A semiconductor electronic circuit, comprising a low melting-point bonding member according to claim 2.

9. A method for mounting a semiconductor electronic circuit, comprising
heating and reflowing, in a range from 105 to 140° C., the low melting-point bonding member according to claim 2 which is disposed between a wiring substrate and a semiconductor chip surface, thereby bonding the wiring substrate and the semiconductor chip.

\* \* \* \* \*